(12) United States Patent
Hiraoka et al.

(10) Patent No.: US 10,892,174 B2
(45) Date of Patent: Jan. 12, 2021

(54) SUBSTRATE CLEANING BRUSH AND SUBSTRATE CLEANING APPARATUS

(71) Applicant: SCREEN Holdings Co., Ltd., Kyoto (JP)

(72) Inventors: Nobuyasu Hiraoka, Kyoto (JP); Wataru Yano, Kyoto (JP); Takashi Shinohara, Kyoto (JP); Katsunori Tanaka, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 36 days.

(21) Appl. No.: 16/198,798

(22) Filed: Nov. 22, 2018

(65) Prior Publication Data

US 2019/0228991 A1     Jul. 25, 2019

(30) Foreign Application Priority Data

Jan. 25, 2018    (JP) ................................ 2018-010496

(51) Int. Cl.

| | |
|---|---|
| *H01L 21/67* | (2006.01) |
| *B08B 3/04* | (2006.01) |
| *B08B 1/00* | (2006.01) |
| *B08B 7/04* | (2006.01) |
| *A46B 13/00* | (2006.01) |
| *B08B 1/04* | (2006.01) |

(52) U.S. Cl.
CPC ........ *H01L 21/67046* (2013.01); *A46B 13/00* (2013.01); *B08B 1/002* (2013.01); *B08B 1/04* (2013.01); *B08B 3/04* (2013.01); *B08B 7/04* (2013.01); *H01L 21/67051* (2013.01)

(58) Field of Classification Search
CPC ......... H01L 21/67046; H01L 21/67051; A46B 13/00; B08B 1/002; B08B 1/04; B08B 3/04; B08B 7/04
See application file for complete search history.

(56) References Cited

U.S. PATENT DOCUMENTS

| | | | |
|---|---|---|---|
| 2003/0041878 A1 | 3/2003 | Shimada et al. | |
| 2016/0243593 A1 | 8/2016 | Tanaka | |
| 2017/0278728 A1* | 9/2017 | Amano | ................ A46B 11/066 |

FOREIGN PATENT DOCUMENTS

| | | |
|---|---|---|
| JP | H10189513 | 7/1998 |
| JP | 2002222788 | 8/2002 |
| JP | 2003068695 | 3/2003 |
| TW | 201637741 | 11/2016 |

* cited by examiner

*Primary Examiner* — Shay Karls
(74) *Attorney, Agent, or Firm* — JCIPRNET

(57) ABSTRACT

A substrate cleaning brush for cleaning a wafer includes a brush main body, a brush holding unit, and a main flow path forming body. The brush main body has a liquid permeable structure and includes a lower surface that comes into contact with a substrate. The brush holding unit holds the brush main body while exposing a distal end portion in a vertical direction of the brush main body to the outside. The main flow path forming body includes a main flow path and a plurality of sub flow paths. The main flow path is formed to allow a processing liquid supplied from the outside to pass therethrough. The plurality of sub flow paths branch off from the main flow path, extend outward in a width direction perpendicular to the vertical direction of the brush main body, and are connected to an upper surface of the brush main body.

14 Claims, 16 Drawing Sheets

SUBSTRATE CLEANING BRUSH AND SUBSTRATE CLEANING APPARATUS

CROSS REFERENCE TO RELATED APPLICATION

The present invention claims priority under 35 U.S.C. § 119 to Japanese Application No. 2018-010496 filed Jan. 25, 2018, the entire content of which is incorporated herein by reference.

BACKGROUND

Technical Field

The subject matter disclosed in this specification relates to a substrate cleaning brush for cleaning a substrate. Examples of the substrate to be processed include, for example, semiconductor substrates, substrates for a liquid crystal display device, substrates for a flat panel display (FPD) such as an organic electroluminescence (organic EL) display device, substrates for an optical disc, substrates for a magnetic disk, substrates for a magneto-optical disc, substrates for a photomask, ceramic substrates, substrates for a solar cell, and the like.

Description of Related Art

In a process of manufacturing a semiconductor substrate, there are cases in which scrub cleaning is performed to clean a substrate. In scrub cleaning, a surface of a substrate is cleaned by supplying a cleaning liquid such as water to a center of the rotating substrate and bringing a distal end of a substrate cleaning brush into contact with the surface of the substrate. A brush main body to be brought into contact with the substrate in the substrate cleaning brush may be, for example, one in a sponge-like form made of polyvinyl alcohol (PVA) or one having a large number of bristles made of polypropylene (PP).

During cleaning of a substrate, there are cases in which particles on a substrate enter fibers of a brush and the particles accumulate in the brush. Therefore, there is a problem in that an expiry time for use of a brush main body is curtailed. Further, also in an unused brush main body, particles may originally be present inside the brush main body.

In this way, there are many cases in which particles are contained inside a brush main body, but it is difficult for the particles to fall out when cleaning from the outside. Therefore, it is preferable to discharge a processing liquid from a brush main body. Such a substrate cleaning brush is described in Patent Document 1 (Japanese Laid-Open No. 2003-68695), for example.

Patent Document 1 describes a point in which pure water is supplied to the inside of a brush and a point in which a cleaning liquid is discharged from the inside of the brush to the outside. Further, in Patent Document 1, a space is formed inside a brush, and a cleaning liquid is supplied into the brush through a tube connected to an upper center of the space. Further, a state in which a processing liquid supplied to the space is discharged from a distal end of the brush is illustrated.

SUMMARY

However, as in Patent Document 1, when a processing liquid is not discharged from an outer circumferential portion of the brush, particles tend to adhere to the outer circumferential portion of the brush. Particularly, since a distal end outer edge portion of the brush is a portion that comes into contact with a portion not being cleaned in the substrate, the distal end outer edge portion of the brush is a portion to which particles from the substrate attach relatively easily. Therefore, a technology for removing particles in an outer circumferential portion of a brush by satisfactorily discharging a processing liquid is required.

The disclosure provides a technology in which removal of particles on an outer circumferential portion of a brush is effectively performed.

According to one embodiment of the disclosure, a substrate cleaning brush configured to clean a substrate includes: a brush main body having an upper surface and a lower surface having a liquid permeable structure and configured to come into contact with the substrate; a main flow path forming body including a main flow path through which a processing liquid supplied from the outside passes; and a plurality of sub flow paths branching off from the main flow path, extending outward in a width direction perpendicular to a vertical direction of the brush main body, and communicating with the upper surface of the brush main body so that the processing liquid is able to pass therethrough.

Since the sub flow paths extend outward in the width direction of the brush main body, the processing liquid having passed through the sub flow paths is supplied to positions closer to an outer circumferential portion than to a center of the brush main body. Thereby, it becomes easier for the processing liquid to permeate the outer circumferential portion of the brush main body to which particles easily adhere. Accordingly, particles on the outer circumferential portion of the brush main body can be effectively removed.

According to an embodiment of the disclosure, a cross-sectional area of each of the sub flow paths is smaller than a cross-sectional area of the main flow path.

According to the extent to which the sub flow path is made narrow with respect to the main flow path, a pressure can be raised. Therefore, a decrease in pressure at the time of discharging the processing liquid can be inhibited.

According to an embodiment of the disclosure, the sub flow paths extend downward in the vertical direction and outward in the width direction.

Since a processing liquid can be guided obliquely outward by the plurality of sub flow paths, it becomes easier for the processing liquid to permeate an outer circumferential portion of the brush main body.

According to an embodiment of the disclosure, the main flow path forming body includes a protruding portion at an intermediate portion of an end portion facing the upper surface, and the brush main body includes a recessed portion into which the protruding portion is press-fitted on the upper surface.

Due to the protruding portion of the main flow path forming body press-fitted into the recessed portion of the brush main body, the brush main body can be firmly connected to the main flow path forming body even when the processing liquid is discharged toward the upper surface of the brush main body.

According to an embodiment of the disclosure, the main flow path forming body and the brush main body have rotational symmetry about a rotation axis extending in the vertical direction.

The substrate cleaning brush is balanced when the substrate cleaning brush is rotated around the rotation axis extending in the vertical direction. Therefore, a substrate can be suitably cleaned by bringing a distal end portion of the brush main body of the substrate cleaning brush rotated in a well-balanced manner into contact with the substrate.

According to an embodiment of the disclosure, the main flow path is formed at a position of the rotation axis.

When the substrate cleaning brush is rotated around the rotation axis, the main flow path also rotates around the rotation axis. At this time, since the substrate cleaning brush is disposed at a position configured to be the rotation axis of the main flow path, the substrate cleaning brush can be rotated in a well-balanced manner.

According to an embodiment of the disclosure, the plurality of sub flow paths include a first sub flow path communicating with the upper surface of the brush main body at a position on a circumference of a first radius around the rotation axis so that the processing liquid is able to pass therethrough; and a second sub flow path communicating with the upper surface of the brush main body at a position on a circumference of a second radius different from the first radius around the rotation axis so that the processing liquid is able to pass therethrough.

The first sub flow path and the second sub flow path are respectively connected to positions on circumferences of different radii on the upper surface of the brush main body. Therefore, it is possible to supply a processing liquid to different positions in a rotational radius direction on the upper surface of the brush main body.

According to an embodiment of the disclosure, a through hole penetrating the brush main body in the vertical direction is formed at an intermediate portion in the width direction of the brush main body.

Due to the through hole formed in the brush main body, a volume of the brush main body can be reduced. Thereby, an amount of particles present in the brush main body can be reduced.

According to an embodiment of the disclosure, the plurality of sub flow paths are formed inside the main flow path forming body, and the plurality of sub flow paths are respectively connected to a plurality of discharge ports formed on a facing surface facing the upper surface of the brush main body in the main flow path forming body.

A processing liquid can be discharged from the plurality of discharge ports toward the upper surface of the brush main body.

According to an embodiment of the disclosure, the plurality of discharge ports are provided at positions overlapping the upper surface of the brush main body in the vertical direction.

Since the processing liquid discharged from the discharge ports is applied to the brush main body, particles inside the brush main body can be discharged to the outside. Also, it is possible to prevent the discharged processing liquid from directly leaving the brush main body without being applied to the brush main body.

According to an embodiment of the disclosure, the plurality of discharge ports are formed with a recess-shaped groove on the facing surface of the main flow path forming body, and the plurality of discharge ports are formed inside the recess-shaped groove.

Since a processing liquid spreads through the recess-shaped groove from the plurality of discharge ports, it is possible to supply the processing liquid over a wider range than the discharge ports on the upper surface of the brush main body.

According to an embodiment of the disclosure, the recess-shaped groove is formed in an annular shape extending in the width direction.

Since the plurality of discharge ports are connected to the recess-shaped groove formed in an annular shape, the processing station discharged from the plurality of discharge ports spreads in an annular shape through the recess-shaped groove. Therefore, the processing liquid can be supplied over a wide range on the upper surface of the brush main body.

According to an embodiment of the disclosure, a cross-sectional area of the first sub flow path is different from a cross-sectional area of the second sub flow path.

It is possible to supply the processing liquid such that a pressure at a position close to a radial inner side of the brush main body is different from a pressure at a position close to a radial outer side thereof. Thereby, the processing liquid is able to permeate the brush main body as a whole.

According to one embodiment of the disclosure, a substrate cleaning apparatus configured to clean a substrate includes a substrate holding unit which holds the substrate, the substrate cleaning brush in any one of the first to thirteenth aspects, a processing liquid supply unit which supplies a processing liquid to the substrate cleaning brush, and a rotating mechanism which rotates the substrate cleaning brush.

A processing liquid can permeate from a base end side toward a distal end side and an outer circumferential side of the brush main body. Thereby, the number of particles inside the brush main body can be reduced, and penetration of particles into the inside of the brush main body can be reduced. Further, since the sub flow path extends toward a lateral side of the brush main body, a processing liquid having passed through the sub flow path is supplied to a position closer to the outside than to a center of the brush main body. Thereby, it becomes easier for the processing liquid to permeate an outer circumferential portion of the brush main body to which particles easily adhere. Accordingly, it is possible to effectively remove particles on an outer circumferential portion of the brush main body.

These and other objects, features, aspects and advantages of the disclosure will become more apparent from the following detailed description of the disclosure when taken in conjunction with the accompanying drawings.

DESCRIPTION OF THE EMBODIMENTS

Figure 1:
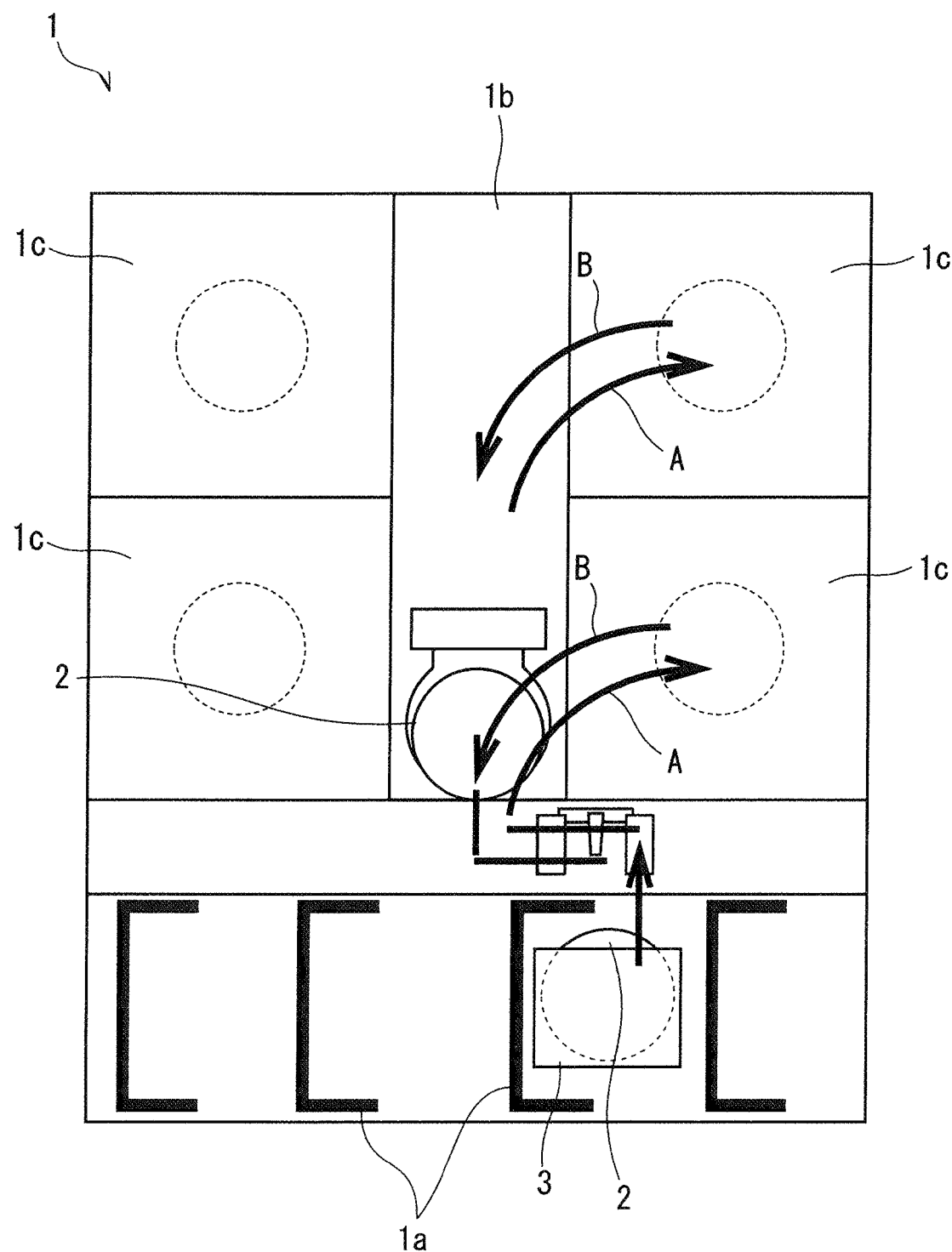
FIG. 1 is a plan view illustrating a substrate cleaning apparatus 1 incorporated in a semiconductor device manufacturing apparatus of a first embodiment.

Hereinafter, embodiments of the disclosure will be described with reference to the accompanying drawings. Constituent elements described in these embodiments are merely examples, and the scope of the disclosure is not limited only to them. In the drawings, for ease of understanding, there are cases in which dimensions and the number of each portion are illustrated in an exaggerated or simplified manner as necessary.

<1. First Embodiment>
<1.1 Configuration and Function>

FIG. 1 is a plan view illustrating a substrate cleaning apparatus 1 incorporated in a semiconductor device manufacturing apparatus of a first embodiment.

The substrate cleaning apparatus 1 is a single-wafer-cleaning processing apparatus, and includes one loader 1a, a transfer path 1b, and a plurality (here, four) of processing units 1c. The loader 1a loads a wafer 2 (substrate) into the substrate cleaning apparatus 1 and unloads the wafer 2 (substrate) from the inside of the substrate cleaning apparatus 1 to the outside. The loading and unloading of the wafer 2 is performed in units of a wafer cassette 3. In one wafer cassette 3, a plurality of sheets of wafers 2 are accommodated.

In FIG. 1, arrows A indicate paths when the wafer 2 is loaded from the wafer cassette 3 to the respective processing units 1c, and arrows B indicate paths when the wafer 2 is returned from the respective processing units 1c to the wafer cassette 3. Further, in FIG. 1, the paths of the wafer 2 are indicated only for the processing units 1c on the right side.

When the wafer cassette 3 is loaded on the loader 1a, as illustrated by the arrows A, a plurality of sheets of the wafers 2 in the wafer cassette 3 are extracted one by one, and each of the extracted wafers 2 are loaded to one of the processing units 1c by a transfer mechanism (transfer arm or the like) of the transfer path 1b. Then, in each processing unit 1c, cleaning and drying processes are performed one at a time. Also, as indicated by the arrows B, the wafers 2 having completed the cleaning and drying processes in the respective processing units 1c are transferred one by one to the loader 1a and are accommodated in the wafer cassette 3 by the transfer mechanism of the transfer path 1b.

Figure 2:
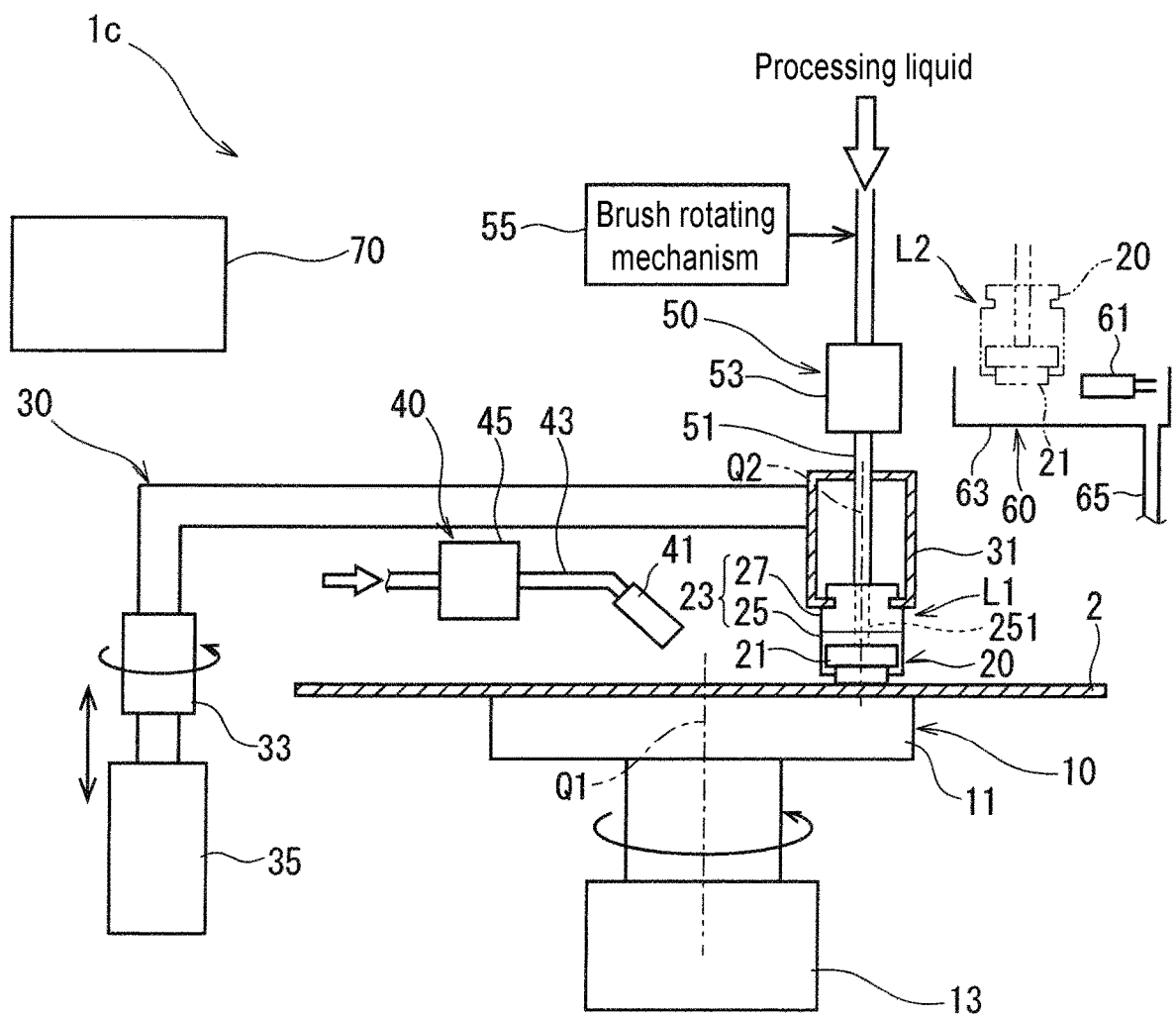
FIG. 2 is a side view schematically illustrating a processing unit 1c of the substrate cleaning apparatus 1.

FIG. 2 is a side view schematically illustrating the processing unit 1c of the substrate cleaning apparatus 1. The processing unit 1c includes a holding mechanism 10, a substrate cleaning brush 20, a brush moving mechanism 30, a processing liquid supply unit 40, a brush processing liquid supply unit 50, a standby unit 60, and a control unit 70.

<Holding Mechanism 10>

The holding mechanism 10 includes a holding chuck 11 that holds the wafer 2 and a motor 13 that rotates the holding chuck 11 around a rotation axis Q1. On an upper surface (a surface upward in a vertical direction) of the holding chuck 11, a plurality of suction holes for sucking a back surface of the wafer 2 are formed. The holding chuck 11 holds the wafer 2 in a horizontal posture by suctioning a center portion of the back surface of the wafer 2 with the plurality of suction holes. The term "horizontal posture" means a state in which the wafer 2 is parallel to a horizontal plane. The motor 13 is configured to be able to change a rotation speed of the holding chuck 11 on the basis of a control signal from the control unit 70.

The holding chuck 11 is not limited to one that suctions and holds the wafer 2. For example, instead of suctioning and holding the center of the back surface of the wafer 2, a plurality of points on a circumferential portion of the wafer 2 may be sandwiched. Specifically, a circumferential portion of the wafer 2 may be gripped by a plurality of pins provided on an upper surface of a stage wider than the wafer 2.

<Substrate Cleaning Brush 20>

The substrate cleaning brush 20 includes a brush main body 21 and a brush holding portion 23. The brush main body 21 is a member which cleans the wafer 2 by a distal end (a lower end portion in the vertical direction) being pressed against the wafer 2. The brush main body 21 has a structure which a liquid (processing liquid) is able to permeate. The brush main body 21 may be, for example, a member made of polyvinyl alcohol (PVA), and may be, for example, formed in a porous sponge form. Further, the brush main body 21 may have a configuration including a large number of bristles made of, for example, polypropylene (PP).

The brush holding portion 23 holds the brush main body 21 while a distal end portion of the brush main body 21 is exposed to the outside. Here, the brush holding portion 23 includes a main flow path forming body 25 and an annular fixing portion 27. The brush main body 21 is fixed to the main flow path forming body 25 by being sandwiched between a lower end portion of the main flow path forming body 25 and the fixing portion 27. A more specific configuration of the substrate cleaning brush 20 will be described below.

<Brush Moving Mechanism 30>

The brush moving mechanism 30 includes a brush arm 31, an arm rotation drive unit 33, and an arm vertical drive unit 35. The brush arm 31 holds the substrate cleaning brush 20 at a distal end thereof. The arm rotation drive unit 33 is constituted by a motor or the like, and rotates the brush arm 31 around a predetermined rotation axis on the basis of a control signal from the control unit 70. The arm vertical drive unit 35 vertically moves the entire brush arm 31 in the vertical direction on the basis of a control signal from the control unit 70. Thereby, the control unit 70 vertically moves the substrate cleaning brush 20.

More specifically, the brush moving mechanism 30 moves the substrate cleaning brush 20 between a cleaning position L1 and a standby position L2. The cleaning position L1 is a position of the substrate cleaning brush 20 when a distal end portion of the substrate cleaning brush 20 (distal end portion of the brush main body 21) is on an upper surface of the wafer 2 held by the holding chuck 11. The standby position L2 is a position on an outer side with respect to the wafer 2 held by the holding chuck 11. The standby position L2 is a position on an upper side of the cleaning position L1.

<Processing Liquid Supply Unit 40>

The processing liquid supply unit 40 includes a nozzle 41, a supply tube 43, and a supply amount regulator 45. The nozzle 41 opens toward a center of the wafer 2 (center of the holding chuck 11) held by the holding chuck 11. The supply tube 43 connected to a processing liquid supply source is connected to the nozzle 41. Also, the supply amount regulator 45 is provided in the supply tube 43. The supply amount regulator 45 regulates a flow rate of a processing liquid supplied to the nozzle 41 through the supply tube 43 on the basis of a control signal from the control unit 70.

<Brush Processing Liquid Supply Unit 50>

The brush processing liquid supply unit 50 supplies a processing liquid to the substrate cleaning brush 20. The brush processing liquid supply unit 50 includes a supply tube 51 and a supply amount regulator 53. A distal end portion of the supply tube 51 is connected to the inside of the substrate cleaning brush 20. Specifically, a distal end of the supply tube 51 is connected to a main flow path 251 formed in the main flow path forming body 25 of the brush holding portion 23. A base end side of the supply tube 51 is connected to a processing liquid supply source (not illustrated). The brush processing liquid supply unit 50 supplies a processing liquid from the processing liquid supply source to the substrate cleaning brush 20 via the supply tube 51 by a pressure-feeding mechanism such as a pump (not illustrated).

<Brush Rotating Mechanism 55>

A brush rotating mechanism 55 rotates the substrate cleaning brush 20 around a rotation axis Q2 extending in the vertical direction. The rotation axis Q2 coincides with a central axis of the brush main body 21, the brush holding portion 23, and the supply tube 51. The brush rotating mechanism 55 rotates the substrate cleaning brush 20 by rotating the supply tube 51 around the rotation axis Q2.

The brush rotating mechanism 55 can be constituted by, for example, an endless belt wrapped around an outer circumference of the supply tube 51 connected to the substrate cleaning brush 20, a motor rotating the endless belt, and the like. The supply tube 51 and the substrate cleaning brush 20 are rotated around the rotation axis Q2 by rotating the endless belt. An operation of the motor is controlled on the basis of a control signal from the control unit 70.

<Standby Unit 60>

The standby unit 60 is provided at a position at which the substrate cleaning brush 20 stands by. The standby unit 60 includes a cleaning liquid supply unit 61, a receiving portion 63, and a drainage tube 65.

The cleaning liquid supply unit 61 supplies a cleaning liquid (for example, pure water) from a nozzle that is open from one lateral side of the substrate cleaning brush 20 disposed at the standby position L2 toward a distal end outer edge portion of the substrate cleaning brush 20 (distal end outer edge portion of the brush main body 21). When a cleaning liquid is discharged from this nozzle toward the distal end outer edge portion of the substrate cleaning brush 20, particles that have adhered to the distal end outer edge portion of the brush main body 21 are removed.

The receiving portion 63 is formed in a box shape that opens upward, and is provided at a position below the substrate cleaning brush 20 disposed at the standby position L2. A cleaning liquid supplied from the cleaning liquid supply unit 61 to the distal end outer edge portion of the brush main body 21 falls downward and is received by the receiving portion 63. A drainage tube 65 is connected to a bottom surface of the receiving portion 63, and a cleaning liquid received by the receiving portion 63 is appropriately drained through the drainage tube 65.

<Control Unit 70>

The control unit 70 controls an operation of each element disposed in the processing unit 1c of the substrate cleaning apparatus 1. A hardware configuration of the control unit 70 is similar to that of a general computer. That is, the control unit 70 includes a central processing unit (CPU) which performs various types of arithmetic processing, a read-only memory (ROM) which is a read-only memory storing basic programs, a random-access memory (RAM) which is a readable/writable memory storing various types of information, and a storage unit which stores control applications, data, and the like. The control unit 70 may include a reading device which reads a portable recording medium (an optical disc, a magnetic disk, a semiconductor memory, or the like). The control unit 70 may be configured to read control applications recorded in such a recording medium and record them in the storage unit.

<Configuration of Substrate Cleaning Brush 20>

Figure 3:
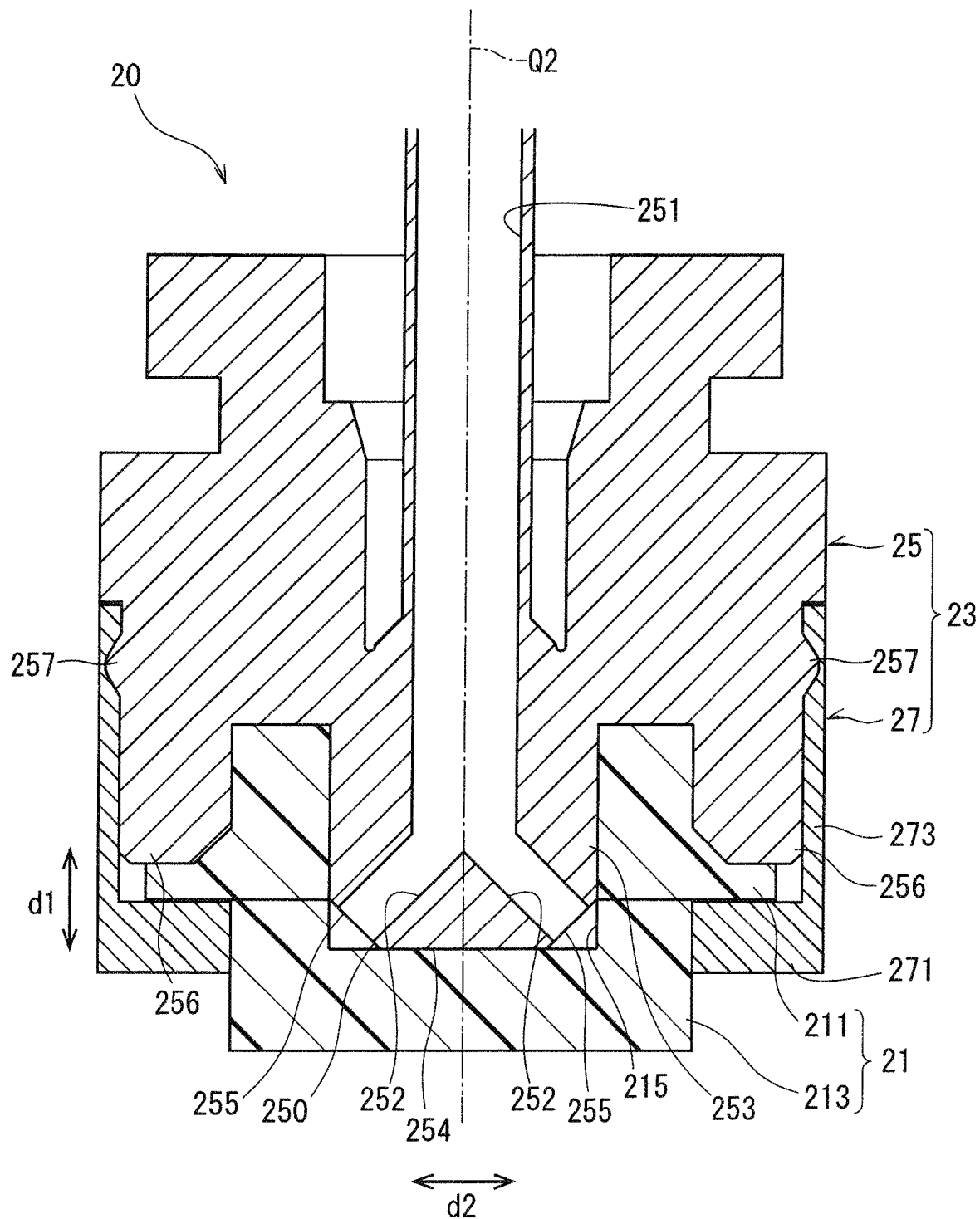
FIG. 3 is a side sectional view illustrating a substrate cleaning brush 20 of the first embodiment.
Figure 4:
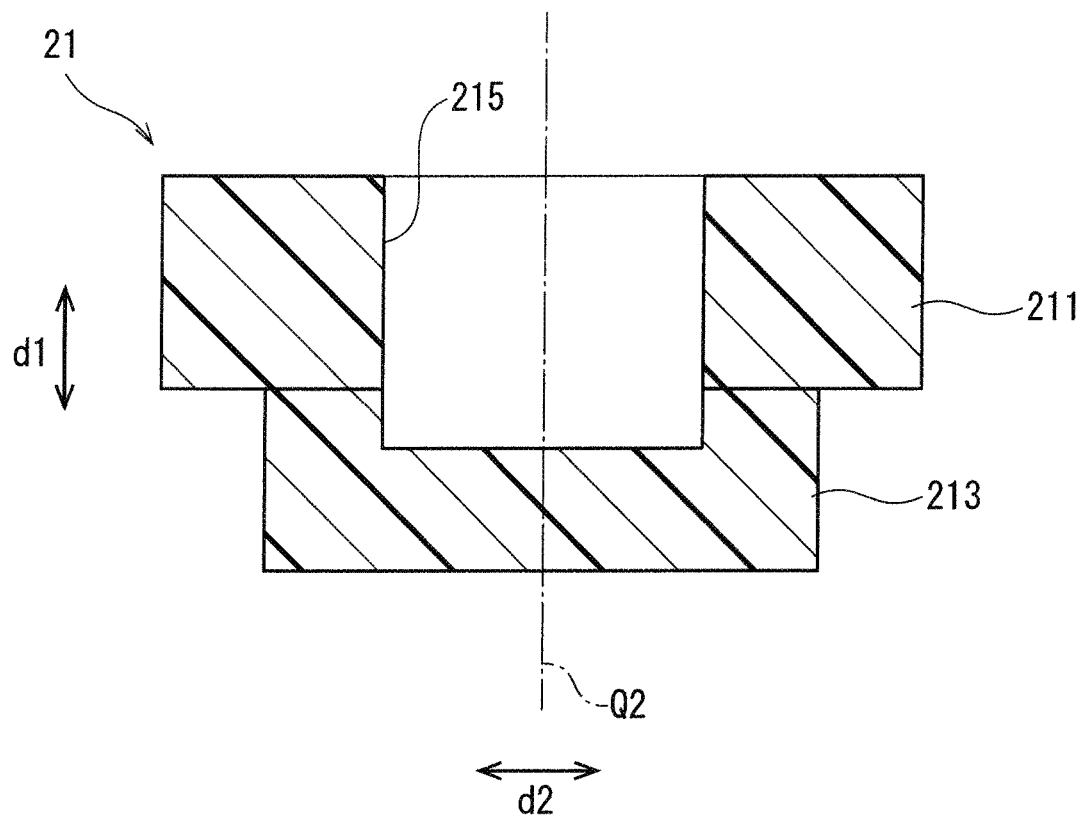
FIG. 4 is a side sectional view illustrating a brush main body 21 of the first embodiment.
Figure 5:
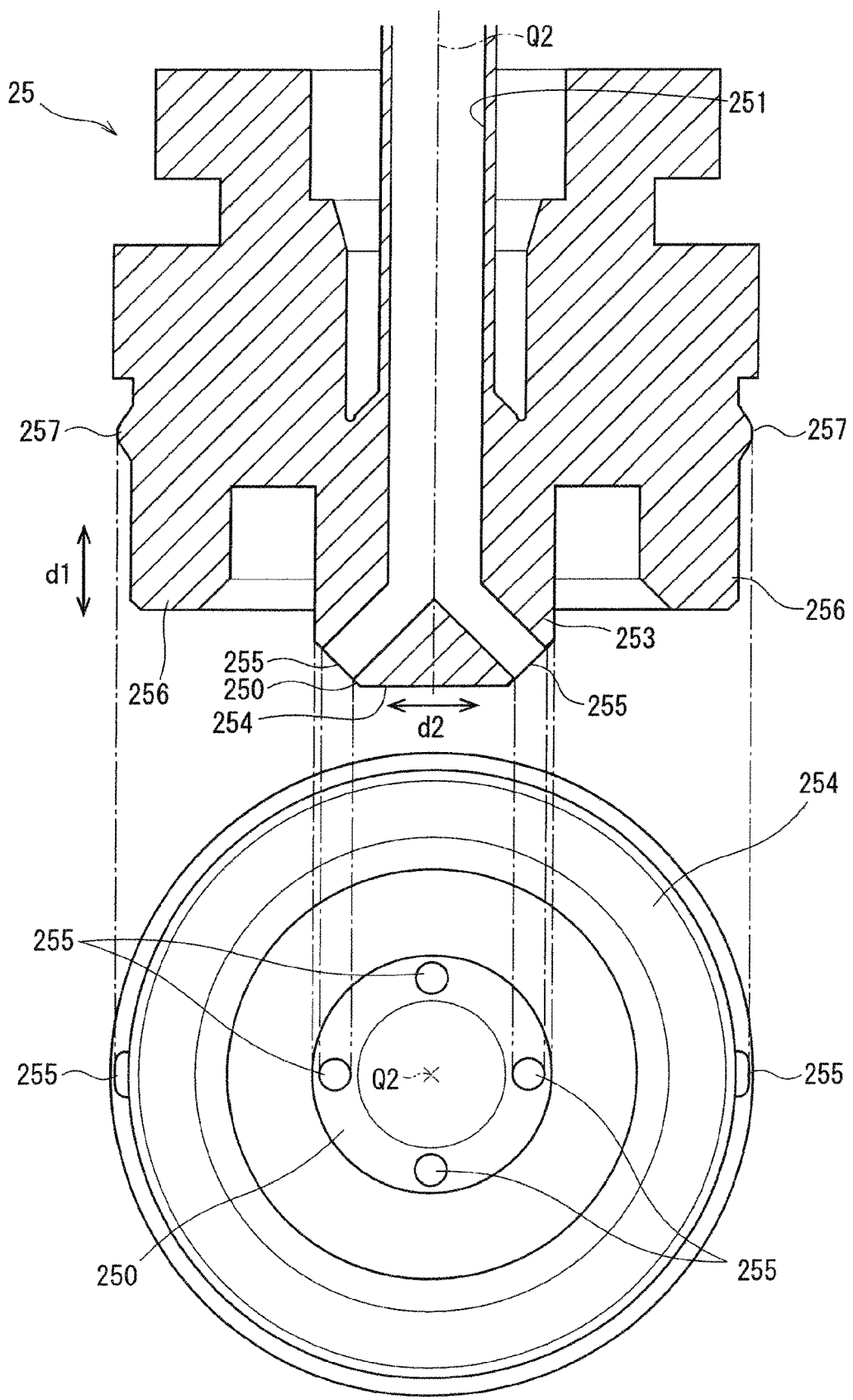
FIG. 5 is a side sectional view and a bottom view illustrating a main flow path forming body 25 of the first embodiment.

FIG. 3 is a side sectional view illustrating the substrate cleaning brush 20 of the first embodiment. FIG. 4 is a side sectional view illustrating the brush main body 21 of the first embodiment. Further, FIG. 5 is a side sectional view and a bottom view illustrating the main flow path forming body 25 of the first embodiment.

As described above, the substrate cleaning brush 20 includes the brush main body 21 and the brush holding portion 23. The brush holding portion 23 includes the main flow path forming body 25 and the fixing portion 27.

As illustrated in FIG. 4, the brush main body 21 includes a wide portion 211 formed in a columnar shape and a narrow portion 213 having a smaller radius than the wide portion 211. The brush main body 21 is constituted by the wide portion 211 and the narrow portion 213 being vertically connected to each other. In the following description, a direction in which the wide portion 211 and the narrow portion 213 are aligned in the brush main body 21 is referred to as a vertical direction d1, and a direction perpendicular to the vertical direction d1 is referred to as a width direction d2. In a state in which the substrate cleaning brush 20 is held by the brush moving mechanism 30, the vertical direction d1 is a vertical direction (gravity direction) and the width direction d2 is a horizontal direction. Also, in a state in which a lower surface (downward surface) of the brush main body 21 of the substrate cleaning brush 20 is in contact with the wafer 2, the vertical direction d1 is a direction perpendicular to a surface of the wafer 2 and the width direction d2 is a direction parallel to the surface of the wafer 2.

The brush main body 21 and the brush holding portion 23 have a shape having rotational symmetry when viewed from the vertical direction. Since the brush main body 21 and the brush holding portion 23 have a rotationally symmetrical shape, the substrate cleaning brush 20 can be rotated around the rotation axis Q2 while maintaining balance.

In a central portion of an upper surface of the wide portion 211, a central recessed portion 215 recessed downward in a columnar shape is formed. In the central recessed portion 215, a columnar central protruding portion 253 formed in the main flow path forming body 25 is inserted. The central protruding portion 253 is formed in the middle (here, a center) of an end portion of the main flow path forming body 25 facing an upper surface (upward surface) of the brush main body 21. An opening width of the central recessed portion 215 is smaller than a width of the central protruding portion 253, and here, an inner diameter of the central recessed portion 215 is smaller than an outer diameter of the central protruding portion 253. Therefore, the central protruding portion 253 is connected to the brush main body 21 in a state of being press-fitted into the central recessed portion 215.

The main flow path forming body 25 includes the main flow path 251 and a plurality of (here, four) sub flow paths 252. The main flow path 251 extends in the vertical direction (vertical direction of the brush main body 21) along the rotation axis Q2 at a center of the main flow path forming body 25. The respective sub flow paths 252 branch off in four directions from a distal end of the main flow path 251 and extend in the width direction d2. That is, each of the sub flow paths 252 extends outward (in a direction away from the rotation axis Q2) from the center (rotation axis Q2) of the main flow path forming body 25. Each of the sub flow paths 252 of the first embodiment extends in a direction having a combination of each of the direction components of the downward vertical direction d1 and the outward width direction d2.

Distal ends of the plurality of sub flow paths 252 are respectively connected to a plurality (here, four) of discharge ports 255 formed in a bottom surface 254 of the main flow path forming body 25. The bottom surface 254 of the main flow path forming body 25 is a facing surface that faces the upper surface of the brush main body 21 (the upper surface of the wide portion 211, including an inner surface of the central recessed portion 215 provided on the upper surface of the wide portion 211). As illustrated in FIG. 5, the plurality of discharge ports 255 are provided at positions away from a center (rotation axis Q2) of the bottom surface 254 of the main flow path forming body 25 outward in the width direction d2. Further, the plurality of discharge ports 255 are provided on the same circumference around the rotation axis Q2 on the bottom surface 254.

The main flow path 251 is connected to the supply tube 51 of the brush processing liquid supply unit 50, and a processing liquid supplied from the brush processing liquid supply unit 50 can pass therethrough. The processing liquid having passed through the main flow path 251 passes through each of the sub flow paths 252 and is supplied from the discharge ports 255 to the upper surface of the brush main body 21 (here, the inner surface of the central recessed portion 215). That is, the plurality of sub flow paths 252 of the substrate cleaning brush 20 are connected to the upper surface of the brush main body 21. Further, in the present application, a state in which two elements are "connected" refers to a state in which the two elements communicate with each other so that a processing liquid can pass therethrough (a state of being connected to each other so that a processing liquid can flow therethrough). Therefore, there is no limitation to a case in which two elements are directly connected. In this example, each of the plurality of sub flow paths 252 is provided to communicate with the upper surface of the brush main body 21 so that a processing liquid can pass therethrough.

In the substrate cleaning brush 20, a processing liquid passes through each of the sub flow paths 252 extending outward, and thus the processing liquid is discharged to positions on an outer side with respect to the center (rotation axis Q 2) of the brush main body 21. Therefore, the substrate cleaning brush 20 has a structure in which a processing liquid easily permeates not only through a central portion of the brush main body 21 but also through an outer circumferential portion thereof. Therefore, it is possible to effectively remove particles also on the outer circumferential portion (especially the distal end outer edge portion) of the brush main body 21 to which particles tend to adhere due to cleaning of the wafer 2. Further, since the processing liquid permeates from the upper surface of the brush main body 21, it is also possible to discharge particles present in the brush main body 21 to the outside.

As illustrated in FIG. 3, each of the discharge ports 255 overlaps the upper surface (upper surface of the wide portion 211) of the brush main body 21 in the vertical direction d1. That is, in a plan view in the vertical direction d1, each of the discharge ports 255 is at a position overlapping the upper surface of the brush main body 21. Therefore, since a processing liquid discharged from the discharge ports 255 is directly applied to the brush main body 21, it is possible to inhibit direct discharge of the processing liquid to the outside of the substrate cleaning brush 20 without passing through the brush main body 21. Thereby, permeation of the processing liquid into the brush main body 21 can be promoted.

Each of the sub flow paths 252 forms a flow path such that a cross-sectional area (opening area) thereof is smaller than a cross-sectional area (opening area) of the main flow path 251. Therefore, it is possible to minimize a decrease in pressure of the processing liquid supplied from the brush processing liquid supply unit 50 in the sub flow path 252. Therefore, it is possible to inhibit a decrease in pressure of a processing liquid discharged from the discharge port 255. Further, the cross-sectional area of the main flow path 251 and the cross-sectional area (opening area) of the sub flow path 252 refer to a size of a cut opening (opening) when each flow path is cut in a direction perpendicular to a central line thereof.

The fixing portion 27 includes an annular plate portion 271 and a side plate portion 273. The annular plate portion 271 is formed in an annular shape having an insertion hole 27h through which the narrow portion 213 of the brush main body 21 can be inserted in a center portion thereof. Also, the side plate portion 273 is an annular portion standing upward in the vertical direction d1 from a circumferential end portion of the annular plate portion 271. The side plate portion 273 is configured such that the side plate portion 273 can be hooked to a locking protrusion 257 provided on an outer circumferential portion of the main flow path forming body 25.

As illustrated in FIG. 3, in a state in which the narrow portion 213 of the brush main body 21 is inserted into the insertion hole 27h of the fixing portion 27, the side plate portion 273 of the fixing portion 27 is locked by the locking protrusion 257 of the main flow path forming body 25. Thereby, the wide portion 211 of the brush main body 21 is sandwiched between the bottom surface 254 of the main flow path forming body 25 and the annular plate portion 271 of the fixing portion 27.

Also, the bottom surface 254 of the main flow path forming body 25 includes an annular protruding portion 256 formed in an annular shape protruding downward in the vertical direction d1 on an outer side of the central protruding portion 253 in the width direction d2. In a state in which the brush main body 21 is sandwiched by the main flow path forming body 25 and the fixing portion 27, an upper outer circumferential portion of the wide portion 211 of the brush main body 21 forms a recessed shape by being pressed by the annular protruding portion 256 over a circumferential direction thereof. In other words, the upper portion of the wide portion 211 of the brush main body 21 is press-fitted between the annular protruding portion 256 and the central protruding portion 253.

In this way, the brush main body 21 is firmly fixed between the main flow path forming body 25 and the fixing portion 27 by the annular protruding portion 256 pressing the brush main body 21. Therefore, even when the rotating brush main body 21 comes into contact with the wafer 2, the brush main body 21 can be satisfactorily rotated together with the brush holding portion 23.

A lower end outer circumferential portion of the central protruding portion 253 of the main flow path forming body 25 forms an inclined surface 250 inclined at a constant inclination from the center of the brush main body 21 (rotation axis Q2) outward in the width direction d2 and toward an upper side in the vertical direction d1 around the rotation axis Q2. The plurality of discharge ports 255 are formed at predetermined angular intervals (here, every 90°) around the rotation axis Q2 on the inclined surface 250. As illustrated in FIG. 3, in a state in which the brush main body 21 is held by the main flow path forming body 25, an annular gap is formed between the main flow path forming body 25 (specifically, the lower end outer circumferential portion of the central protruding portion 253) and the brush main body 21 (specifically, a bottom surface of the central recessed portion 215) by the inclined surface 250. Thereby, since a processing liquid discharged from each of the discharge ports 255 annularly spreads through this gap, it becomes easier for the processing liquid to permeate toward the entire outer circumferential portion of the brush main body 21. That is, permeation of the processing liquid into the brush main body 21 as a whole becomes easier.

<1.2 Operation Explanation>

Figure 6:
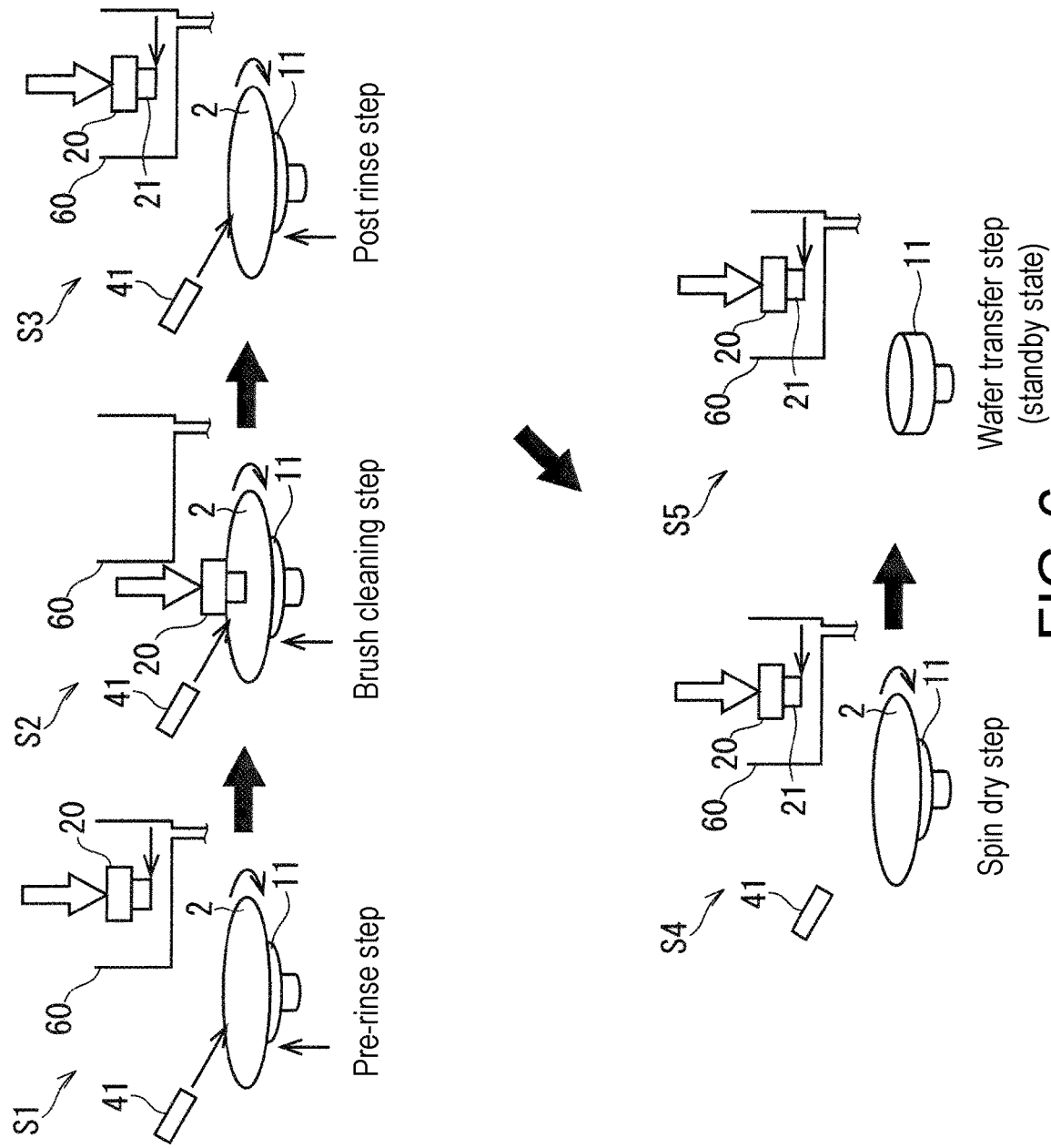
FIG. 6 is a view illustrating a flow of a cleaning process in the substrate cleaning apparatus 1 of the first embodiment.

FIG. 6 is a view illustrating a flow of a cleaning process in the substrate cleaning apparatus 1 of the first embodiment. In the following description, it is assumed that pure water (deionized water (DIW)) is used as a processing liquid and a cleaning liquid, but a processing liquid and a cleaning liquid are not limited thereto.

Here, it is assumed that the wafer 2 is loaded into the processing unit 1c and the wafer 2 is held by the holding chuck 11. When the wafer 2 is loaded, the substrate cleaning brush 20 is disposed at the standby position L2 above the standby unit 60.

In a state in which the wafer 2 is held by the holding chuck 11, the control unit 70 performs a pre-rinse step S1. In the pre-rinse step S1, the nozzle 41 supplies a processing liquid (for example, pure water) to the center of the wafer 2 (rotation axis Q1). Also, in the pre-rinse step S1, the motor 13 of the holding mechanism 10 rotates the wafer 2 at a predetermined rotation speed. When a predetermined time has elapsed since the supply of the processing liquid to the upper surface of the wafer 2 was started, the brush moving mechanism 30 starts to move the substrate cleaning brush 20 from the standby position L2 toward the cleaning position L1 on the wafer 2.

After the pre-rinse step S1, the control unit 70 performs a brush cleaning step S2. In the brush cleaning step S2, the nozzle 41 supplies DIW to the center of the wafer 2, and the brush moving mechanism 30 brings the distal end portion of the substrate cleaning brush 20 into contact with the center of the wafer 2. Then, the brush moving mechanism 30 moves the substrate cleaning brush 20 to a circumferential edge (edge) of the wafer 2. At this time, by the wafer 2 rotating at a predetermined rotation speed, the entire upper surface of the wafer 2 is cleaned by the substrate cleaning brush 20. Also, while the distal end portion of the substrate cleaning brush 20 is in contact with the upper surface of the wafer 2, the brush rotating mechanism 55 rotates the substrate cleaning brush 20.

In the brush cleaning step S2, a rotation speed of the wafer 2 is, for example, 200 rpm to 1000 rpm, a discharge flow rate of the processing liquid (for example, pure water) from the nozzle 41 is, for example, 300 mL/min to 1000 mL/min, and an amount of pushing against the wafer 2 by the distal end portion of the substrate cleaning brush 20 is, for example, 0.5 mm.

Also, in the brush cleaning step S2, a cleaning liquid (for example, pure water) is supplied to the substrate cleaning brush 20 from the brush processing liquid supply unit 50 while the substrate cleaning brush 20 is in contact with the wafer 2. Therefore, the substrate cleaning brush 20 cleans the wafer 2 while the processing liquid is exuded from the brush main body 21. Thereby, particles generated in the brush main body 21 due to the wafer 2 or the like can be prevented from penetrating into the inside of the brush main body 21 or adhering to the brush main body 21 after having penetrated into the brush main body 21. Further, as described above, in the substrate cleaning brush 20, it is possible to effectively remove particles adhered to the distal end outer edge portion of the brush main body 21 with the processing liquid exuded from the brush main body 21. Therefore, the wafer 2 can be satisfactorily cleaned.

After the brush cleaning step S2, the control unit 70 performs a post rinse step S3. In the post rinse step S3, the nozzle 41 supplies a processing liquid (for example, pure water) toward the center of the rotating wafer 2. The processing liquid supplied to the center of the wafer 2 moves toward the circumferential edge portion along the upper surface of the rotating wafer 2 and is then shaken off to the outside of the wafer 2. Thereby, foreign matter such as particles generated in the brush cleaning step S2 is removed from the upper surface of the wafer 2.

In the post rinse step S3, the brush moving mechanism 30 moves the substrate cleaning brush 20 from the cleaning position L1 to the standby position L2. The cleaning liquid supply unit 61 of the standby unit 60 discharges a cleaning liquid (for example, pure water) for cleaning the brush main body 21 from one side toward a lower end outer edge portion of the substrate cleaning brush 20 disposed at the standby position L2. At this time, the cleaning liquid is applied over the entire circumference of the lower end outer edge portion of the brush main body 21 by the brush rotating mechanism 55 rotating the substrate cleaning brush 20. Thereby, particles that have adhered to the lower end outer edge portion are effectively removed.

Further, in the post rinse step S3, the brush processing liquid supply unit 50 supplies a processing liquid to the substrate cleaning brush 20. Due to this processing liquid exuded from the brush main body 21, particles that have adhered to the brush main body 21 can be effectively removed.

After the post rinse step S3, the control unit 70 performs a spin dry step S4. In the spin dry step S4, discharge of the processing liquid from the nozzle 41 is stopped. Then, the motor 13 of the holding mechanism 10 rotates the wafer 2 at a high speed. A rotation speed of the wafer 2 at this time is higher than that in the pre-rinse step S1 or the post rinse step S3. Due to this high-speed rotation, the cleaning liquid remaining on the wafer 2 is shaken off to the outside of the wafer 2, and thereby the upper surface of the wafer 2 is dried. The motor 13 continues the rotation of the wafer 2 for a predetermined time, and then stops the rotation of the wafer 2.

In the spin dry step S4, following the post rinse step S3, the cleaning liquid supply unit 61 of the standby unit 60 supplies a cleaning liquid to the distal end portion of the rotating substrate cleaning brush 20. Further, the brush processing liquid supply unit 50 supplies a processing liquid to the substrate cleaning brush 20. Thereby, the substrate cleaning brush 20 in a standby state can be effectively cleaned by effectively utilizing the time for drying the wafer 2.

After the spin dry step S4, the control unit 70 performs a wafer transfer step S5. In the wafer transfer step S5, the holding of the wafer 2 by the holding chuck 11 is released, and the wafer 2 in which the brush cleaning process has been completed is taken out from the processing unit 1c by the transfer mechanism. The transfer mechanism returns the wafer 2 to the wafer cassette 3 and performs loading of a next wafer 2 into the processing unit 1c.

In the wafer transfer step S5, subsequent to the spin dry step S4, the cleaning liquid supply unit 61 of the standby unit 60 supplies a cleaning liquid to the distal end portion of the rotating substrate cleaning brush 20. Also, the brush processing liquid supply unit 50 supplies a processing liquid to the substrate cleaning brush 20. Thereby, the substrate cleaning brush 20 in a standby state can be cleaned by effectively utilizing the time for transferring the wafer 2.

<2. Second Embodiment>

Next, a second embodiment will be described. In the following description, elements having the same functions as those already described will be denoted by the same reference signs or reference signs to which alphabetical letters or the like are added, and detailed description thereof may be omitted.

Figure 7:
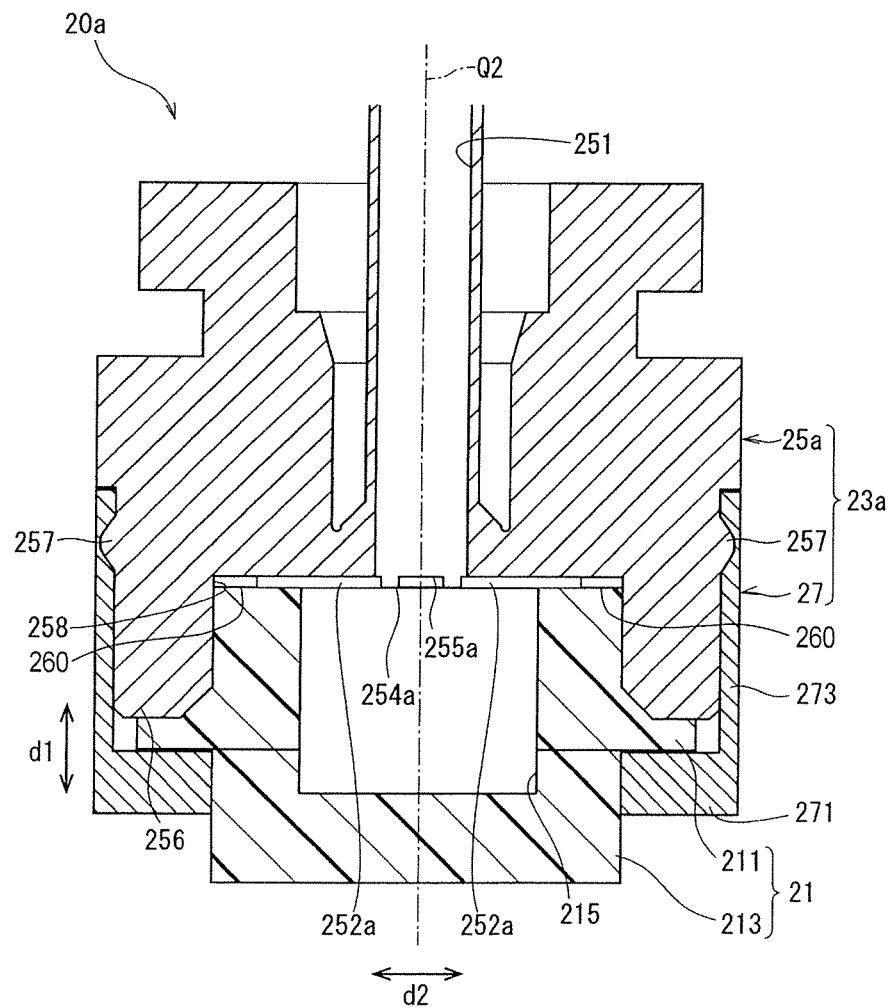
FIG. 7 is a side sectional view illustrating a substrate cleaning brush 20a of a second embodiment.
Figure 8:
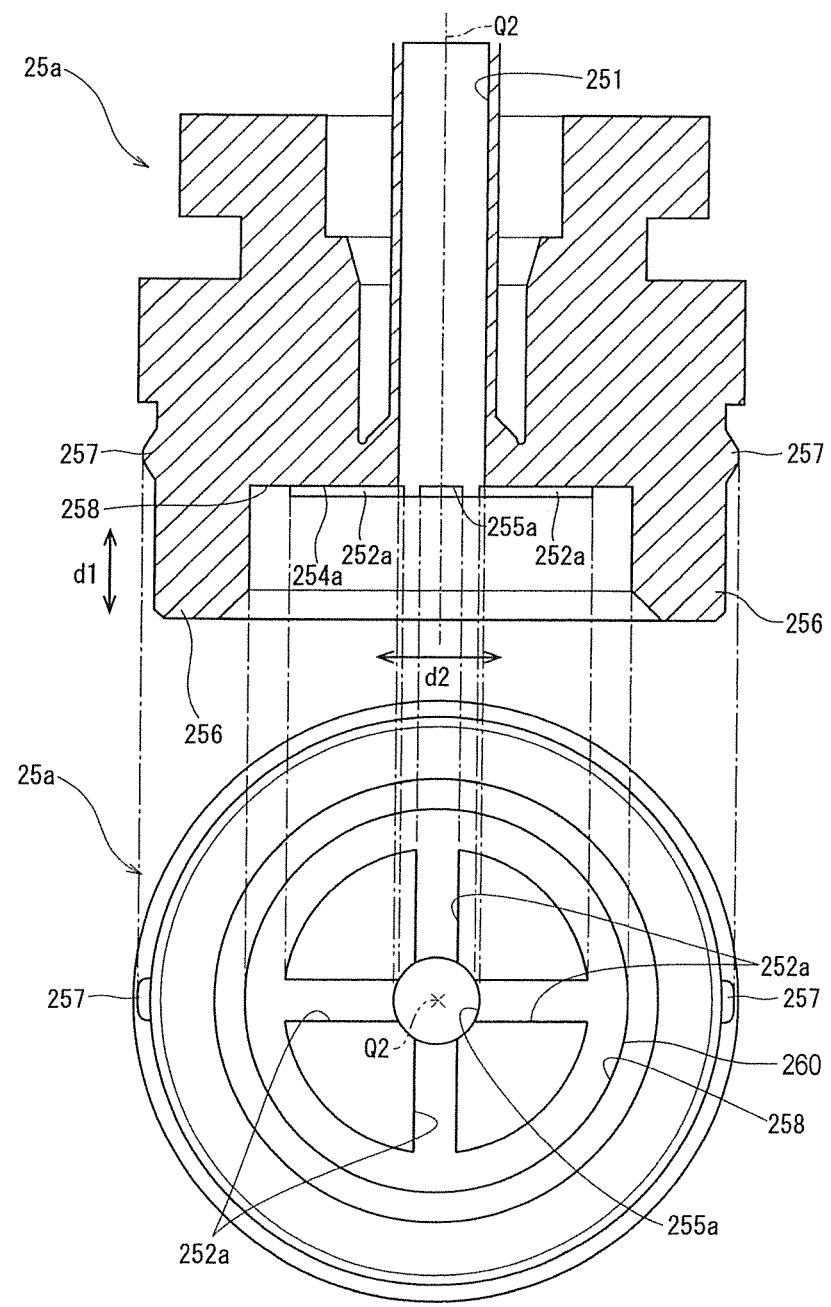
FIG. 8 is a side sectional view and a bottom view illustrating a main flow path forming body 25a of the second embodiment.
Figure 9:
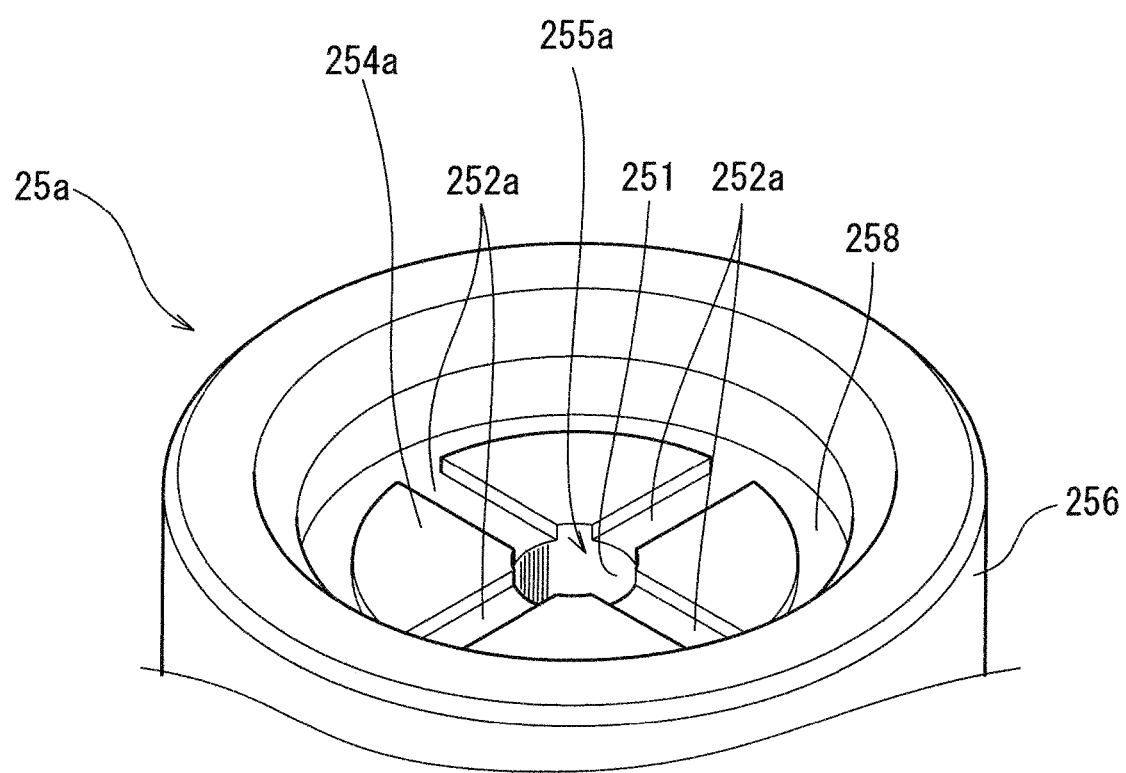
FIG. 9 is a partial perspective view illustrating a bottom surface 254a side of the main flow path forming body 25a of the second embodiment.

FIG. 7 is a side sectional view illustrating a substrate cleaning brush 20a of a second embodiment. FIG. 8 is a side sectional view and a bottom view illustrating a main flow path forming body 25a of the second embodiment. FIG. 9 is a partial perspective view illustrating a bottom surface 254a side of the main flow path forming body 25a of the second embodiment.

As illustrated in FIG. 7, the substrate cleaning brush 20a includes a brush main body 21 and a brush holding portion 23a. The brush holding portion 23a includes the main flow path forming body 25a and a fixing portion 27.

The main flow path forming body 25a schematically has a shape in which the central protruding portion 253 of the main flow path forming body 25 is omitted. Also, a main flow path 251 formed in the main flow path forming body 25a is connected to a discharge port 255a formed at a central portion of a bottom surface 254a of the main flow path forming body 25a. The discharge port 255a faces a center of an upper surface of a wide portion 211 (specifically, a bottom surface of a central recessed portion 215).

As illustrated in FIGS. 8 and 9, the discharge port 255a is connected to a plurality of sub flow paths 252a. Each of the sub flow paths 252a of the present embodiment is a recess-shaped groove linearly extending outward in a width direction from a center (rotation axis Q2) on the bottom surface 254a of the main flow path forming body 25a. More specifically, the four sub flow paths 252a extend outward in the width direction in a cross shape from the discharge port 255a at the center of the main flow path forming body 25a on the bottom surface 254a. Then, the sub flow paths 252a of the present embodiment are open downward and thus are open toward an upper surface of the brush main body 21 (more specifically, the upper surface of the wide portion 211 including the bottom surface of the central recessed portion 215).

Further, each of the distal ends of the plurality of sub flow paths 252a is connected to a recess-shaped annular groove 258 formed on the bottom surface 254a. The annular groove 258 is formed in an annular shape around the rotation axis Q2 on the bottom surface 254a. As illustrated in FIG. 7, a lower side of the annular groove 258 is blocked by the wide portion 211 of the brush main body 21. That is, in the substrate cleaning brush 20a, the distal end of each of the sub flow paths 252a is connected to an annular flow path 260 surrounded by the annular groove 258 and the brush main body 21.

When a brush processing liquid supply unit 50 supplies a processing liquid to the substrate cleaning brush 20a, the processing liquid passes through the main flow path 251 and is discharged from the discharge port 255a toward the brush main body 21. The discharged processing liquid is accumulated in the central recessed portion 215 of the brush main body 21. Thereby, the processing liquid permeates downward in a vertical direction d1 and outward in a width direction d2 from a central portion on an upper surface side of the brush main body 21. Therefore, it is possible to effectively remove particles that have adhered to a central portion and a distal end outer edge portion of a narrow portion 213.

Also, the discharged processing liquid spreads outward in the width direction d2 through the sub flow path 252a, and spreads to an upper surface portion of the wide portion 211 on an outer side of the central recessed portion 215. Therefore, it becomes easier for the processing liquid discharged from the discharge port 255a to permeate toward an outer circumferential portion of the brush main body 21. Further, the processing liquid can spread in a circular shape through the flow path surrounded by the annular groove 258 and the brush main body 21. Thereby, the processing liquid can easily permeate over an entire outer circumferential portion of the brush main body 21. Therefore, particles that have adhered to a distal end outer edge portion of the brush main body 21 can be effectively removed.

<3. Third Embodiment>

Figure 10:
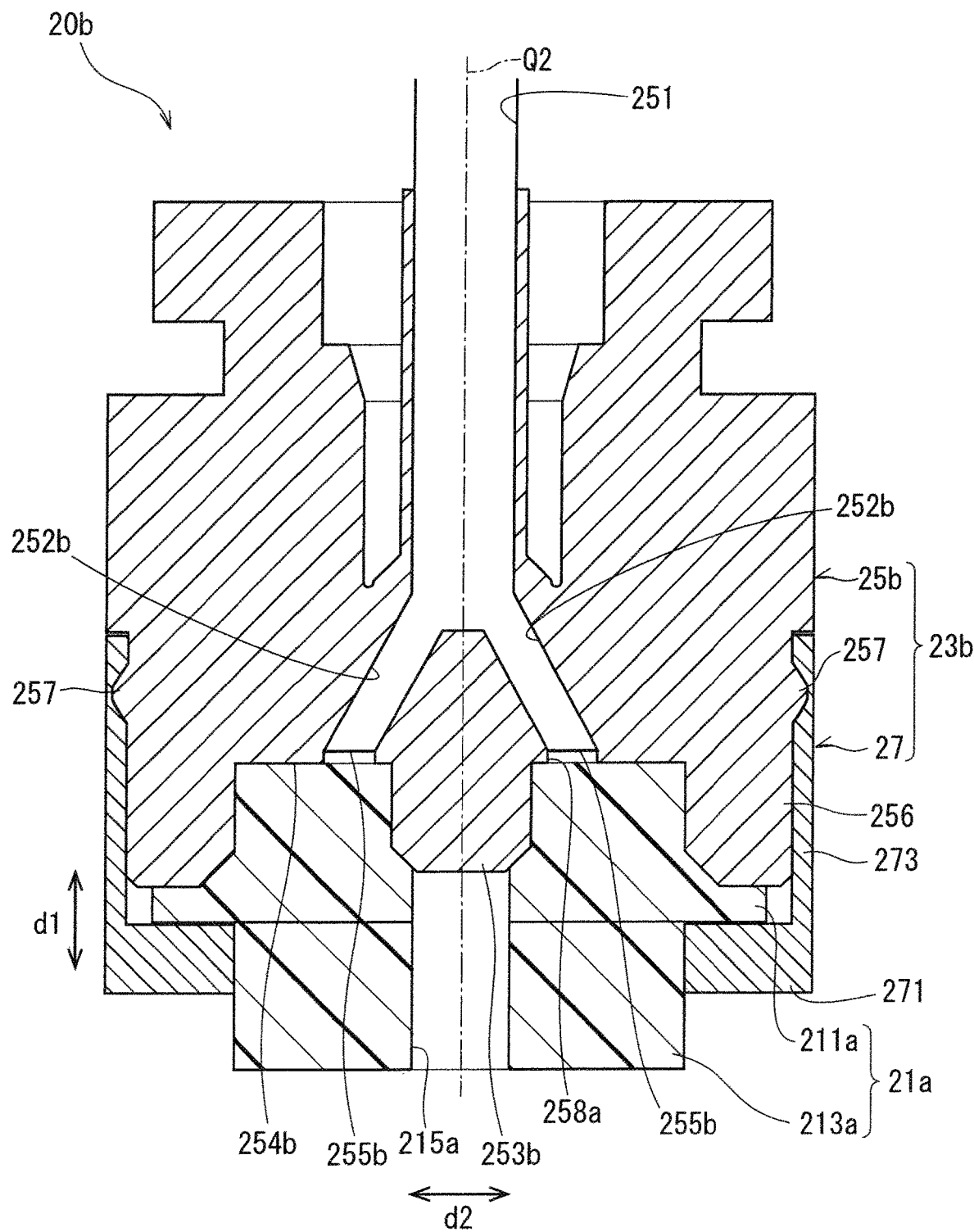
FIG. 10 is a side sectional view illustrating a substrate cleaning brush 20b of a third embodiment.
Figure 11:
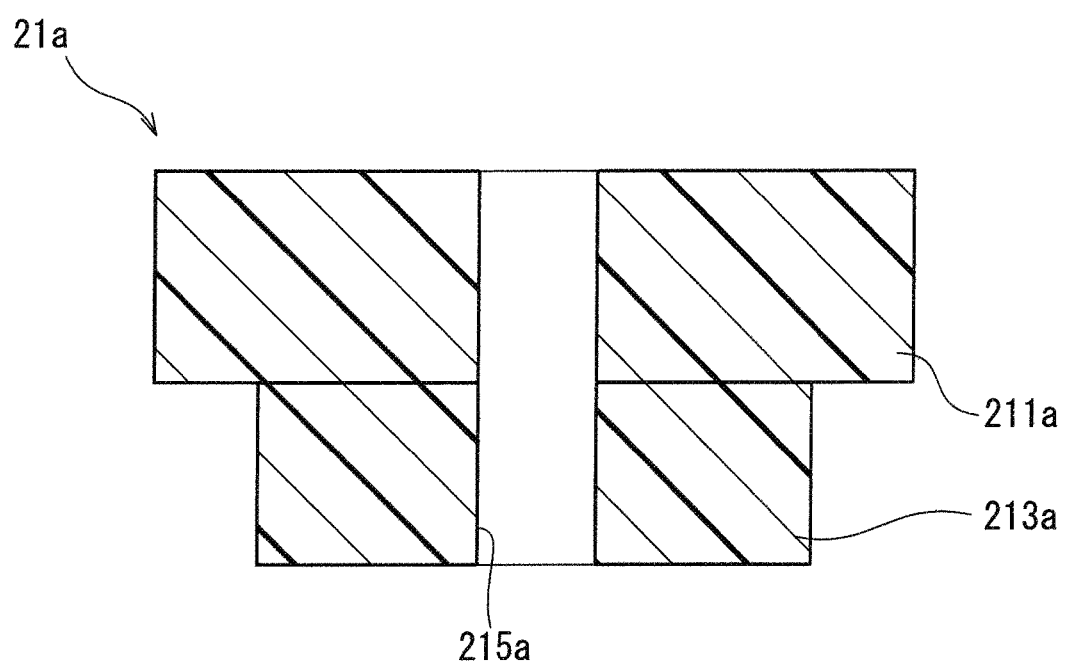
FIG. 11 is a side sectional view illustrating a brush main body 21a of the third embodiment.
Figure 12:
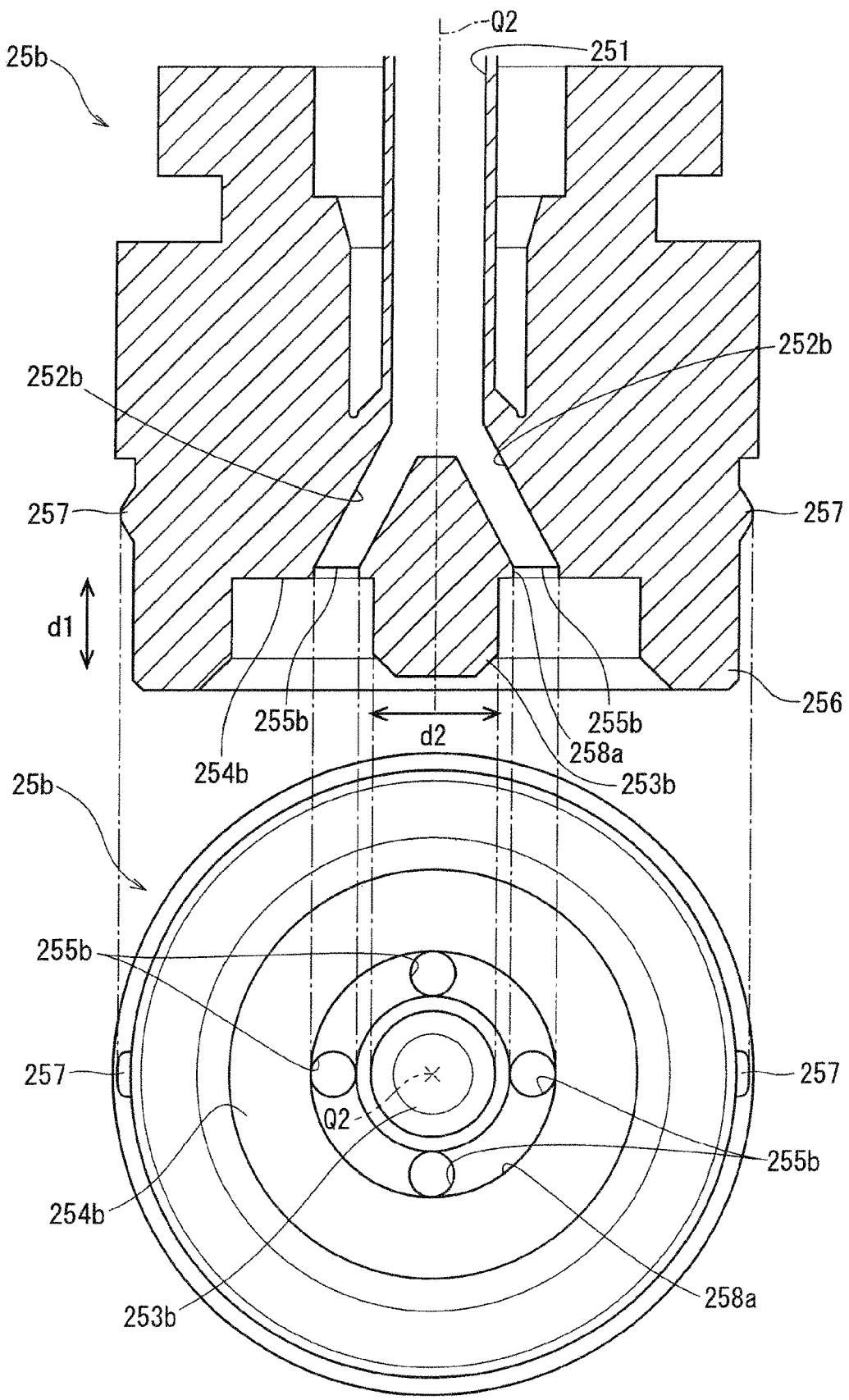
FIG. 12 is a side sectional view and a bottom view illustrating a main flow path forming body 25b of the third embodiment.

FIG. 10 is a side sectional view illustrating a substrate cleaning brush 20b of a third embodiment. FIG. 11 is a side sectional view illustrating a brush main body 21a of the third embodiment. FIG. 12 is a side sectional view and a bottom view illustrating a main flow path forming body 25b of the third embodiment.

As in the brush main body 21, the brush main body 21a includes a wide portion 211a and a narrow portion 213a. In the brush main body 21a, a central through hole 215a penetrating the brush main body 21a in a vertical direction d1 is formed at a center (rotation axis Q2) in a width direction d2.

As illustrated in FIG. 10, a brush holding portion 23b includes the main flow path forming body 25b and a fixing portion 27. As in the central protruding portion 253 of the main flow path forming body 25, the main flow path forming body 25b includes a central protruding portion 253b formed in a columnar shape and protruding downward in the vertical direction d1 at a center in the width direction d2 of a bottom surface 254b. However, a width of the central protruding portion 253b is smaller than that of the central protruding portion 253, and a protrusion height is also smaller than that of the central protruding portion 253. Here, a lower end of the central protruding portion 253a is on an upper side with respect to a lower end of an annular protruding portion 256.

In the central through hole 215a, the central protruding portion 253b of the main flow path forming body 25b is inserted. An opening width of the center through hole 215a is smaller than a width of the central protruding portion 253b, and here, an inner diameter of the central through hole 215a is smaller than an outer diameter of the central protruding portion 253b. Therefore, the central protruding portion 253b is firmly connected to the brush main body 21a in a state of being press-fitted to the central through hole 215a.

A main flow path 251 formed in the main flow path forming body 25b branches off into a plurality (here, four) of sub flow paths 252b at a distal end thereof. Each of the sub flow paths 252b extends downward in the vertical direction d1 and outward in the width direction d2 from a center (rotation axis Q2) of the main flow path forming body 25b in the width direction d2. Then, a distal end of each sub flow path 252b is connected to a discharge port 255b. A cross-sectional area (opening area) of each sub flow path 252b is smaller than a cross-sectional area (opening area) of the main flow path 251.

A plurality (here, four) of the discharge ports 255b are provided at positions on an outer side of the central protruding portion 253b in the width direction d2 on the bottom surface 254b of the main flow path forming body 25b. In the present embodiment, as illustrated in the bottom view of FIG. 12, four discharge ports 255b are provided on the same circumference around the rotation axis Q2.

As illustrated in FIG. 10, each of the discharge ports 255b overlaps an upper surface (upper surface of the wide portion 211a) of the brush main body 21a in the vertical direction d1. That is, in a plan view in the vertical direction d1, each of the discharge ports 255b is at a position overlapping the upper surface of the brush main body 21a. Therefore, since a processing liquid discharged from each of the discharge ports 255b is applied to the upper surface of the brush main body 21a, it is possible to inhibit direct discharge of the processing liquid to the outside of the substrate cleaning brush 20b without passing through the brush main body 21a. Thereby, permeation of the processing liquid into the brush main body 21 can be increased.

Also, an annular groove 258a in an annular shape around the rotation axis Q2 is formed on the bottom surface 254b of the main flow path forming body 25b. The annular groove 258a is formed to surround a periphery of the central protruding portion 253b. Here, four discharge ports 255b are formed inside the annular groove 258a (specifically, on an inner bottom surface). A lower side of the annular groove 258a is blocked by the wide portion 211a of the brush main body 21a. Therefore, a processing liquid discharged from each of the discharge ports 255b spreads in a circular shape through a flow path surrounded by the annular groove 258a and the brush main body 21a. Therefore, the main flow path forming body 25b has a structure in which a processing liquid easily permeates over an entire outer circumferential portion of the brush main body 21. Therefore, according to the main flow path forming body 25b, particles that have adhered to a distal end outer edge portion and the outer circumferential portion of the brush main body 21a can be effectively removed.

Also, since the through hole is provided in a central portion of the brush main body 21a, an amount of particles originally present in the brush main body 21a can be reduced. Further, an amount of particles entering the inside of the brush main body 21a and adhering thereto at the time of processing the wafer 2 can be effectively reduced. Also, an inner portion of a lower end portion of the brush main body 21a is smaller than an outer portion thereof in terms of a proportional contribution contributing to wafer cleaning. Therefore, even when the inner portion of the distal end portion is omitted as in the brush main body 21a, a decrease in wafer cleaning ability is small. Therefore, as described above, a cleaning ability of the substrate cleaning brush 20b can be improved by reducing an amount of particles present in the brush main body 21a.

<4. Fourth Embodiment>

Figure 13:
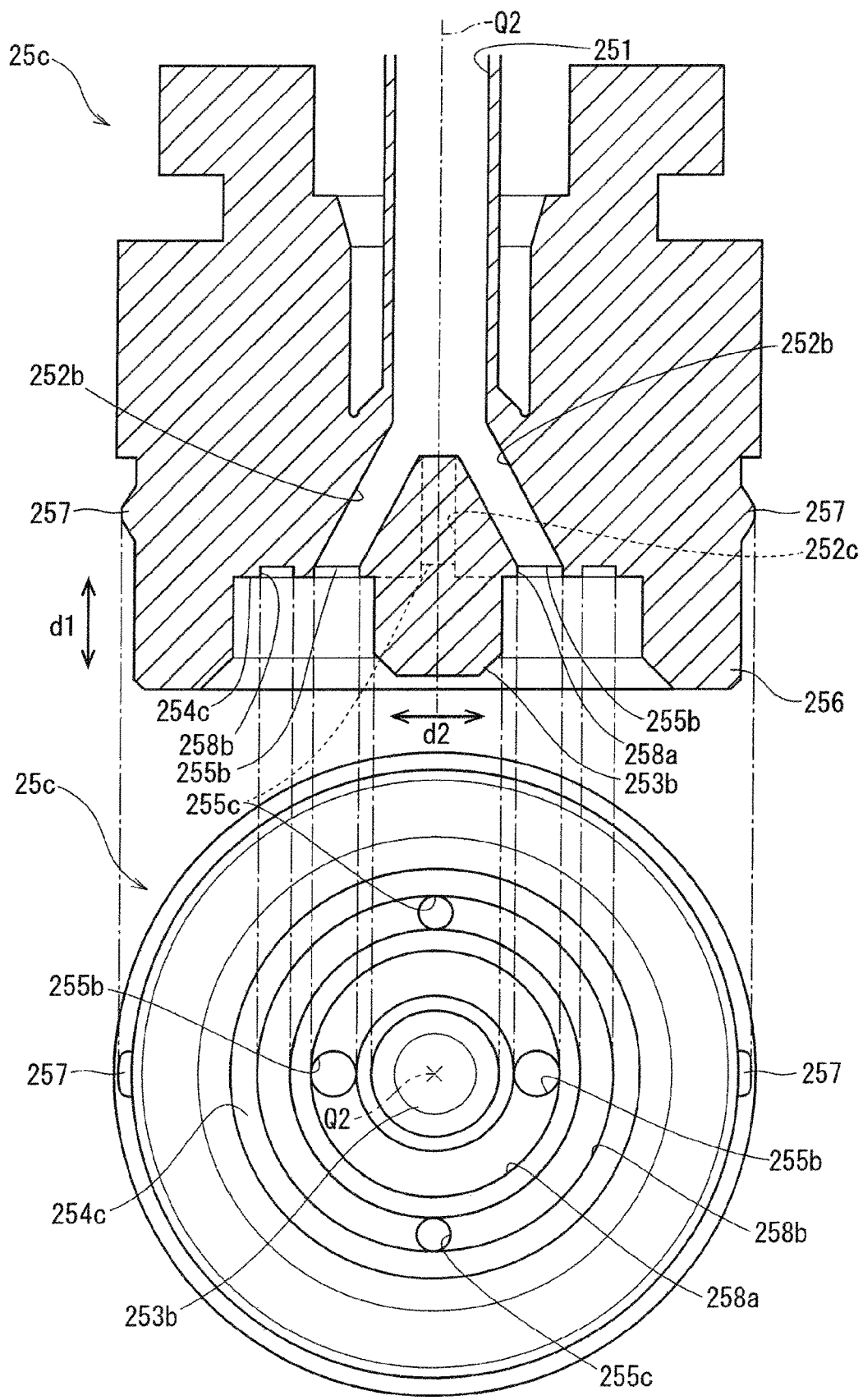
FIG. 13 is a side sectional view and a bottom view illustrating a main flow path forming body 25c of a fourth embodiment.

FIG. 13 is a side sectional view and a bottom view illustrating a main flow path forming body 25c of a fourth embodiment. The main flow path forming body 25c has a shape similar to that of the main flow path forming body 25b of the third embodiment illustrated in FIG. 12. However, the main flow path forming body 25c differs from the main flow path forming body 25b in the following points.

First, a pair of discharge ports 255b and a pair of discharge ports 255c are formed on a bottom surface 254c of the main flow path forming body 25c. The pair of discharge ports 255c are provided on the same circumference around a rotation axis Q2. In addition, the pair of discharge ports 255b are disposed on an inner side of the pair of discharge ports 255c. When it is assumed that a radius of a circumference on which the pair of discharge ports 255b are disposed is a first radius and a radius of a circumference on which the pair of discharge ports 255c are disposed is a second radius, the first radius is smaller than the second radius. Also, the pair of discharge ports 255b are formed in an inner bottom surface of an annular groove 258a having the first radius and the pair of discharge ports 255c are formed in an inner bottom surface of an annular groove 258b having the second radius.

Inside the main flow path forming body 25c, a pair of sub flow paths 252b and a pair of sub flow paths 252c branching off from the distal end of the main flow path 251 are formed. As in the sub flow paths 252b, the sub flow paths 252c extend downward in a vertical direction d1 and outward in a width direction d2 from a center of the main flow path forming body 25b. Then, the pair of sub flow paths 252c are respectively connected to the pair of discharge ports 255c. Further, a cross-sectional area (opening area) of each of the sub flow paths 252c is smaller than a cross-sectional area (opening area) of each of the sub flow paths 252b. Therefore, a water pressure of a processing liquid passing through the sub flow path 252c is higher than a water pressure of a processing liquid passing through the sub flow path 252b. Therefore, a decrease in pressure of a processing liquid on a side close to an outer circumferential portion of a brush main body 21a can be inhibited.

Further, while the cross-sectional area of the sub flow path 252c is smaller than the cross-sectional area of the sub flow path 252b in the present embodiment, inversely, the former may be larger. Also, the opening area of the discharge port 255c may also be larger than the opening area of the discharge port 255b.

In this way, when positions of the discharge ports 255b and 255c are made to be different from each other, a processing liquid can be supplied to an inner side position and an outer side position of the brush main body 21a. Thereby, permeation of the processing liquid into the brush main body 21a as a whole becomes easier.

<5. Fifth Embodiment>

Figure 14:
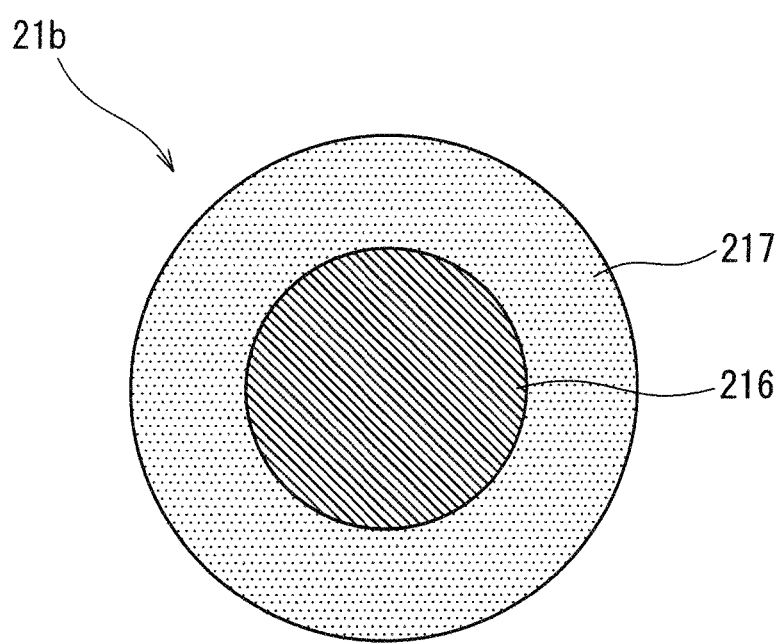
FIG. 14 is a view illustrating a bottom surface of a brush main body 21b of a fifth embodiment.

FIG. 14 is a view illustrating a bottom surface of a brush main body 21b of a fifth embodiment. The brush main body 21b is constituted by a polypropylene (PP) brush 216 formed in a columnar shape and a polyvinyl acetate (PVA) brush 217 formed in an annular shape to surround an outer side of the PP brush 216. The PP brush 216 is a member formed of a large number of bristles made of PP. Also, the PVA brush 217 is a member made of PVA which is porous sponge-like form.

According to the brush main body 21b, since the inner PP brush 216 is relatively hard, foreign matter on a wafer 2 can be rubbed off. Further, the rubbed off foreign matter can be discharged to the outside of the wafer 2 by the PVA brush 217 on the outer side.

Further, since an amount of particles that have adhered to the brush main body 21*b* can be reduced by causing a cleaning liquid to exude from the PP brush 216 and the PVA brush 217, the brush main body 21*b* can be used for a long time.

<6. Sixth Embodiment>

In the above-described embodiments, a plurality of sub flow paths 252, 252*a* to 252*c* are respectively formed in the main flow path forming bodies 25 and 25*a* to 25*c* of the brush holding portion 23. However, sub flow paths may be formed in a brush main body.

Figure 15:
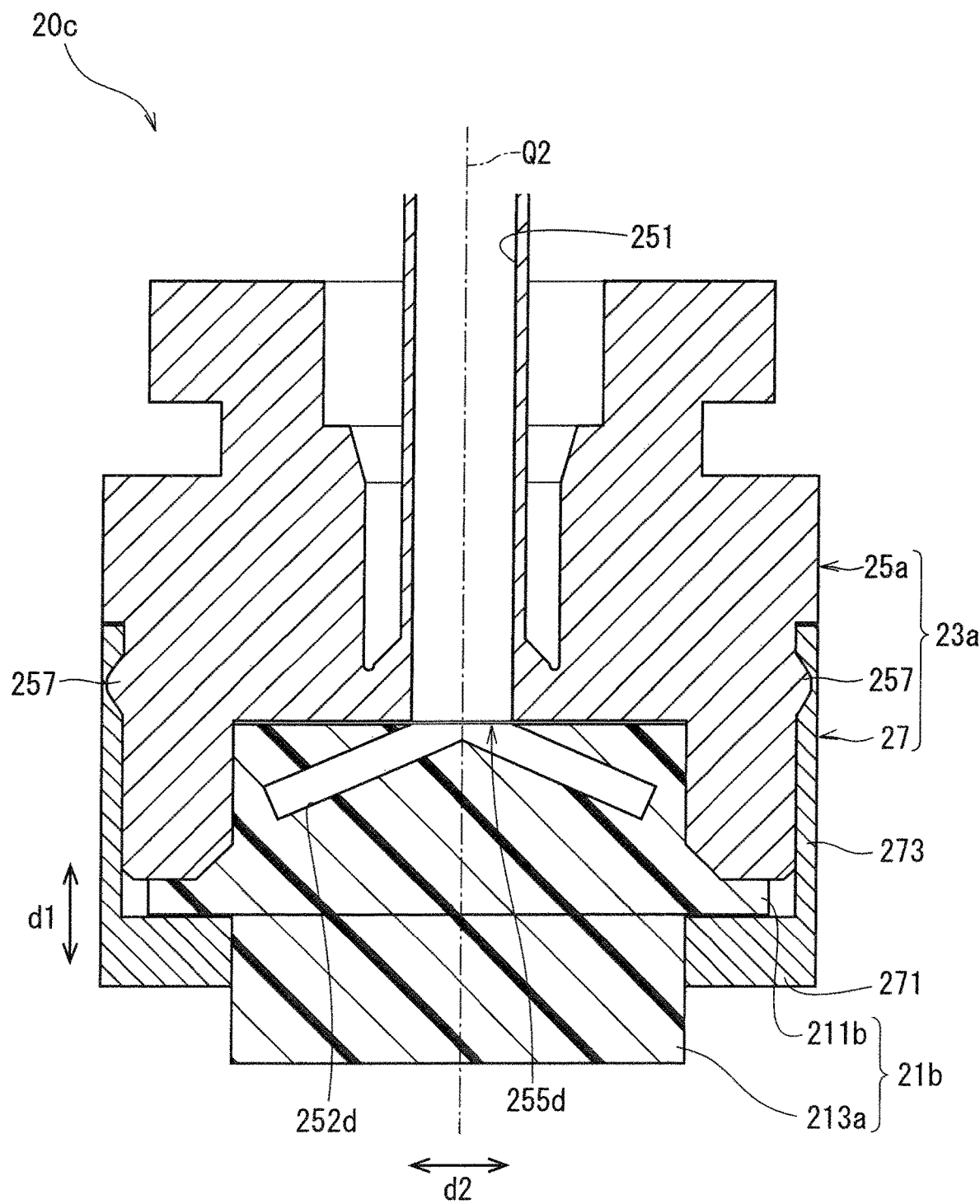
FIG. 15 is a side sectional view illustrating a substrate cleaning brush 20c of a sixth embodiment.

FIG. 15 is a side sectional view illustrating a substrate cleaning brush 20*c* of a sixth embodiment. The substrate cleaning brush 20*c* includes a main flow path forming body 25*d* in which a main flow path 251 is formed, and a brush main body 21*b* in which a plurality (for example, four) of sub flow paths 252*d* are formed.

More specifically, the main flow path 251 vertically penetrates the main flow path forming body 25*d* and is connected to a discharge port 255*d* formed at a center (a position through which a rotation axis Q2 passes) of a lower surface of the main flow path forming body 25*d*. Also, each of the sub flow paths 252*d* is connected to the discharge port 255*d* at a center (a position through which a rotation axis Q2 passes) of an upper surface of the brush main body (specifically, a wide portion 211*b*). That is, each of the sub flow paths 252*d* branches off from the main flow path 251. Then, each sub flow path 252*d* extends outward in a width direction d2 from a center of the brush main body 21*d*. Then, a distal end (end) of each sub flow path 252*d* is positioned inside the brush main body 21*c*.

Each sub flow path 252*d* is a hole formed from an upper portion of the brush main body 21*d* toward the inside, and the sub flow path 252*d* is connected to an upper surface of the brush main body 21*d* (a back portion of the sub flow path 252*d*). In other words, the plurality of sub flow paths 252*d* communicate with the upper surface of the brush main body 21*d* so that a processing liquid discharged from the discharge port 255*d* can pass therethrough.

Since a processing liquid can be guided to a position close to an outer circumferential portion of the brush main body by such sub flow paths 252*d* formed in the brush main body 21*d*, the processing liquid can satisfactorily permeate from the upper surface side toward a lower surface and a side surface in the brush main body 21*d*.

For example, a flow path may be formed inside the brush main body 21*c* so that the plurality of sub flow paths 251*d* can be connected to each other. For example, it is conceivable that the flow path be an annular flow path extending annularly around a rotation center Q2 and passing through respective positions in intermediate portions or distal end portions of the plurality of sub flow paths 252*d*. When such a flow path is formed, a processing liquid can spread into the brush main body 21*c*.

<7. Seventh Embodiment>

Figure 16:
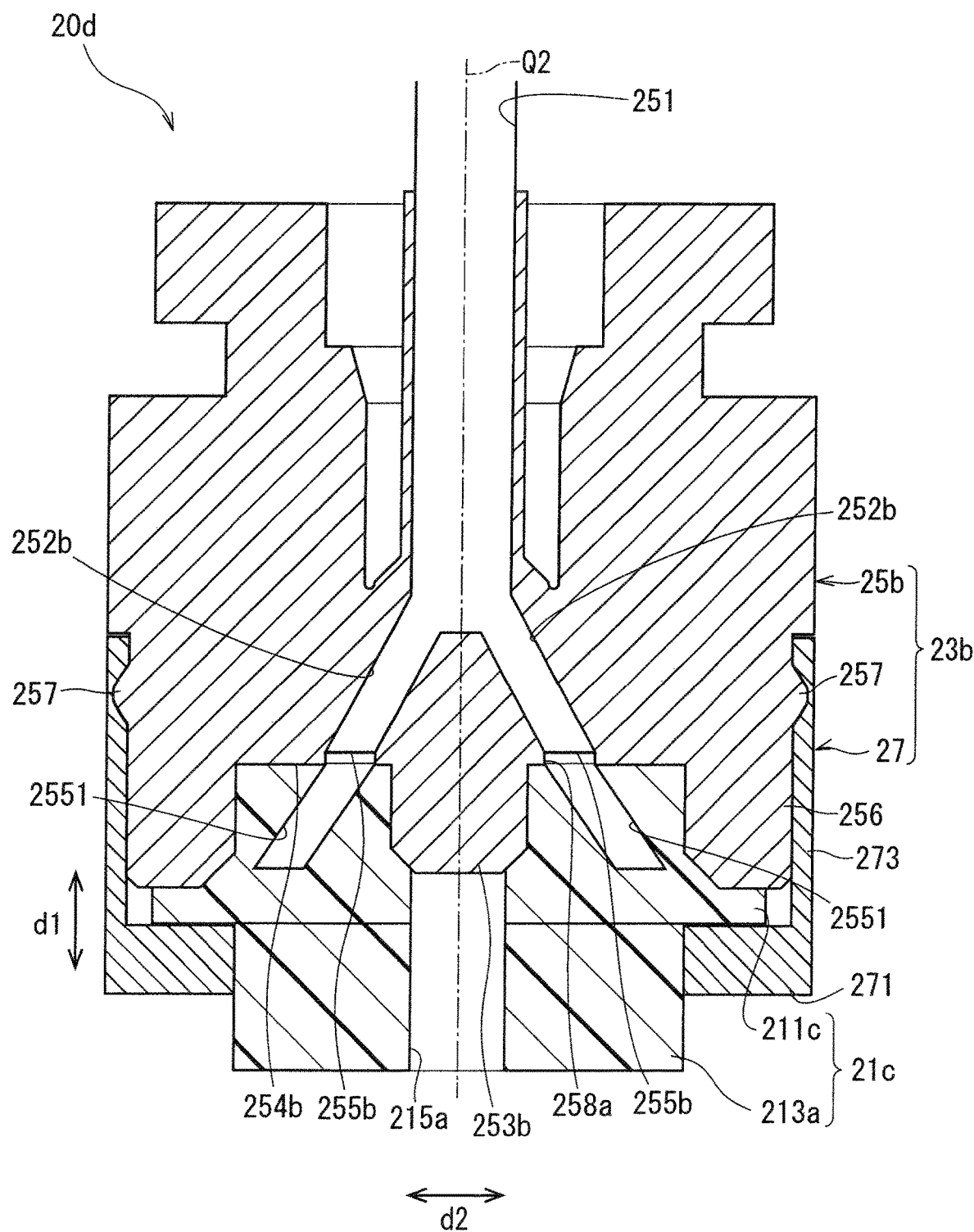
FIG. 16 is a side sectional view illustrating a substrate cleaning brush 20d of a seventh embodiment.

Although the sub flow paths 252*d* are formed in the brush main body 21*c* in the sixth embodiment, but the sub flow paths may be formed across both a main flow path forming body and a brush main body. FIG. 16 is a side sectional view illustrating a substrate cleaning brush 20*d* of a seventh embodiment.

The substrate cleaning brush 20*d* is different from the substrate cleaning brush 20*b* of the third embodiment in that a brush main body 21*c* is provided instead of the brush main body 21*a* illustrated in FIG. 10. As illustrated in FIG. 16, the brush main body 21*c* includes a plurality (for example, four) of sub flow paths 2551. Each of the sub flow paths 2551 is provided such that each of a plurality of sub flow paths 252*b* formed in the main flow path forming body 25*b* is extended.

More specifically, each inlet of the plurality of sub flow paths 2551 is formed at an upper portion of the brush main body 21*c* (specifically, wide portion 211*c*), and each inlet is set at respective positions of discharge ports 255*b*. Further, the sub flow paths 2551 respectively extend outward in a width direction d2 of the brush main body 21*a* from the inlets. Then, each of the sub flow paths 2551 is connected to an upper surface of the brush main body 21*a* (back portion of the sub flow path 2551).

Further, it is not indispensable that the sub flow path 2551 be provided on an extension line of the discharge port 255*b*. For example, the sub flow path 2551 may be connected to the sub flow path 252*b* by being connected to an annular groove 258*a* at an arbitrary position.

While the disclosure has been illustrated and described in detail, the foregoing description is in all aspects illustrative and not restrictive. It is therefore understood that numerous modifications and variations can be devised without departing from the scope of the disclosure.

What is claimed is:

1. A substrate cleaning brush configured to clean a substrate, comprising:
   a brush main body comprising:
      an upper surface;
      a lower surface configured to come into contact with the substrate; and
      a structure comprising porous sponge or a large number of bristles, which a liquid is permeable from the upper surface to the lower surface;
   a main flow path forming body comprising a main flow path through which a processing liquid supplied from the outside passes; and
   a plurality of sub flow paths branching off from the main flow path, extending outward in a width direction perpendicular to a vertical direction of the brush main body, and communicating with the upper surface of the brush main body so that the processing liquid is able to pass therethrough,
   wherein the main flow path forming body comprises a facing surface facing the upper surface of the brush main body,
   the facing surface of the main flow path forming body forms an annular flow path together with the upper surface of the main brush body, the annular flow path extending along with an outer circumferential portion of the main brush body, and
   each of the plurality of sub flow paths communicates with the main flow path and the annular flow path and between the main flow path and the annular flow path.

2. The substrate cleaning brush according to claim 1, wherein a cross-sectional area of each of the sub flow paths is smaller than a cross-sectional area of the main flow path.

3. The substrate cleaning brush according to claim 1, wherein the sub flow paths extend downward in the vertical direction and outward in the width direction.

4. The substrate cleaning brush according to claim 1, wherein
   the main flow path forming body comprises a protruding portion at an intermediate portion of an end portion facing the upper side, and the brush main body comprises a recessed portion into which the protruding portion is press-fitted on the upper surface.

5. The substrate cleaning brush according to claim 1, wherein the main flow path forming body and the brush main body have rotational symmetry about a rotation axis extending in the vertical direction.

6. The substrate cleaning brush according to claim 5, wherein the main flow path is formed at a position of the rotation axis.

7. The substrate cleaning brush according to claim 5, wherein the plurality of sub flow paths comprise:
 a first sub flow path communicating with the upper surface of the brush main body at a position on a circumference of a first radius around the rotation axis so that the processing liquid is able to pass therethrough; and
 a second sub flow path communicating with the upper surface of the brush main body at a position on a circumference of a second radius different from the first radius around the rotation axis so that the processing liquid is able to pass therethrough.

8. The substrate cleaning brush according to claim 7, wherein a cross-sectional area of the first sub flow path is different from a cross-sectional area of the second sub flow path.

9. The substrate cleaning brush according to claim 1, wherein a through hole penetrating the brush main body in the vertical direction is formed at an intermediate portion in the width direction of the brush main body.

10. The substrate cleaning brush according to claim 1, wherein
 the plurality of sub flow paths are formed inside the main flow path forming body, and
 the plurality of sub flow paths are respectively connected to a plurality of discharge ports formed on a facing surface facing the upper surface of the brush main body in the main flow path forming body.

11. The substrate cleaning brush according to claim 10, wherein the plurality of discharge ports are provided at positions overlapping the upper surface of the brush main body in the vertical direction.

12. The substrate cleaning brush according to claim 10, wherein
 the plurality of discharge ports are formed with a recess-shaped groove on the facing surface of the main flow path forming body, and
 the plurality of discharge ports are formed inside the recess-shaped groove.

13. The substrate cleaning brush according to claim 12, wherein the recess-shaped groove is formed in an annular shape extending in the width direction.

14. A substrate cleaning apparatus configured to clean a substrate, comprising:
 a substrate holding unit which holds the substrate;
 the substrate cleaning brush of claim 1;
 a processing liquid supply unit which supplies a processing liquid to the substrate cleaning brush; and
 a rotating mechanism which rotates the substrate cleaning brush.

* * * * *